United States Patent
Higuchi et al.

(10) Patent No.: US 7,981,286 B2
(45) Date of Patent: Jul. 19, 2011

(54) SUBSTRATE PROCESSING APPARATUS AND METHOD OF REMOVING PARTICLES

(75) Inventors: Ayumi Higuchi, Kyoto (JP); Kenichiro Arai, Kyoto (JP)

(73) Assignee: Dainippon Screen Mfg Co., Ltd. (JP)

( * ) Notice: Subject to any disclaimer, the term of this patent is extended or adjusted under 35 U.S.C. 154(b) by 1573 days.

(21) Appl. No.: 11/226,640

(22) Filed: Sep. 14, 2005

(65) Prior Publication Data

US 2006/0054191 A1   Mar. 16, 2006

(30) Foreign Application Priority Data

Sep. 15, 2004 (JP) ................................ 2004-268006
Sep. 29, 2004 (JP) ................................ 2004-283465
Nov. 16, 2004 (JP) ................................ 2004-331543

(51) Int. Cl.
*C02F 1/24* (2006.01)
*B08B 3/04* (2006.01)
*B08B 3/10* (2006.01)
*B08B 3/14* (2006.01)
*B01D 19/00* (2006.01)
*H01L 21/304* (2006.01)

(52) U.S. Cl. ........... 210/221.2; 210/167.01; 210/167.31; 210/196; 216/96; 134/111; 134/902; 156/345.18

(58) Field of Classification Search ............. 210/167.01, 210/167.31, 196, 221.1, 221.2; 216/93; 134/111, 134/902; 156/345.18
See application file for complete search history.

(56) References Cited

U.S. PATENT DOCUMENTS

| | | | |
|---|---|---|---|
| 4,817,652 A * | 4/1989 | Liu et al. .................... | 134/102.1 |
| 4,865,632 A | 9/1989 | Yano et al. | |
| 5,928,509 A | 7/1999 | Sugiura | |
| 5,979,474 A * | 11/1999 | Manako ..................... | 134/102.1 |
| 6,001,189 A * | 12/1999 | Rolfson .......................... | 134/10 |
| 6,241,827 B1 * | 6/2001 | Tanaka et al. .................... | 134/18 |
| 6,284,055 B1 * | 9/2001 | Dryer et al. ..................... | 134/10 |
| 6,357,458 B2 | 3/2002 | Tanaka et al. | |

FOREIGN PATENT DOCUMENTS

| | | | |
|---|---|---|---|
| EP | 423396 A2 * | 4/1991 | |
| JP | 02-052013 A | 2/1990 | |
| JP | 2-268879 | 11/1990 | |
| JP | 03-123605 A | 5/1991 | |
| JP | 6-179989 | 6/1994 | |

(Continued)

OTHER PUBLICATIONS

Office Action issued by the Japanese Patent Office on Nov. 4, 2009 in connection with corresponding Japanese application No. 2004-331543.

English translation of Office Action issued by Japanese Patent Office on Nov. 4, 2009 in connection with Japanese application No. 2004-331543.

Japanese Office Action dated May 26, 2009 in corresponding Japanese Patent Application No. 2004-331543 (with English language translation).

Japanese Office Action dated May 26, 2009 in corresponding Japanese Patent Application No. 2004-268006 (with English language translation).

(Continued)

*Primary Examiner* — Thomas M Lithgow
(74) *Attorney, Agent, or Firm* — Ostrolenk Faber LLP

(57) ABSTRACT

A liquid within a processing tank is caused to overflow, and the overflowing liquid is circulated by a circulation system. In this process, bubbles are discharged into the liquid within the processing tank. Thus, particles within the processing tank are not only carried along by a flow of the liquid but also attach to the bubbles to be carried with the bubbles outwardly of the processing tank. A dip-type substrate processing apparatus removes the particles within the processing tank in a short time with efficiency.

6 Claims, 20 Drawing Sheets

FOREIGN PATENT DOCUMENTS

| | | |
|---|---|---|
| JP | 6-179991 | 6/1994 |
| JP | 7-326570 | 2/1995 |
| JP | 10-85723 | 4/1998 |
| JP | 11-162903 | 6/1999 |
| JP | 11-233477 | 8/1999 |
| JP | 2000-200767 | 7/2000 |
| JP | 2000262810 A * | 9/2000 |
| JP | 2002-085905 | 3/2002 |
| JP | 2003-093982 | 4/2003 |
| JP | 2003-210907 | 7/2003 |
| JP | 2004-000951 | 1/2004 |
| JP | 2004-121962 | 4/2004 |
| JP | 2004122066 A * | 4/2004 |

OTHER PUBLICATIONS

Japanese Office Action dated May 26, 2009 in corresponding Japanese Patent Application No. 2004-283465 (with English language translation).

Office Action issued by the Japanese Patent Office on Sep. 15, 2009 in connection with corresponding Japanese application No. 2004-283465.

English translation of Office Action issued by Japanese Patent Office on Sep. 15, 2009 in connection with Japanese application No. 2004-283465.

* cited by examiner

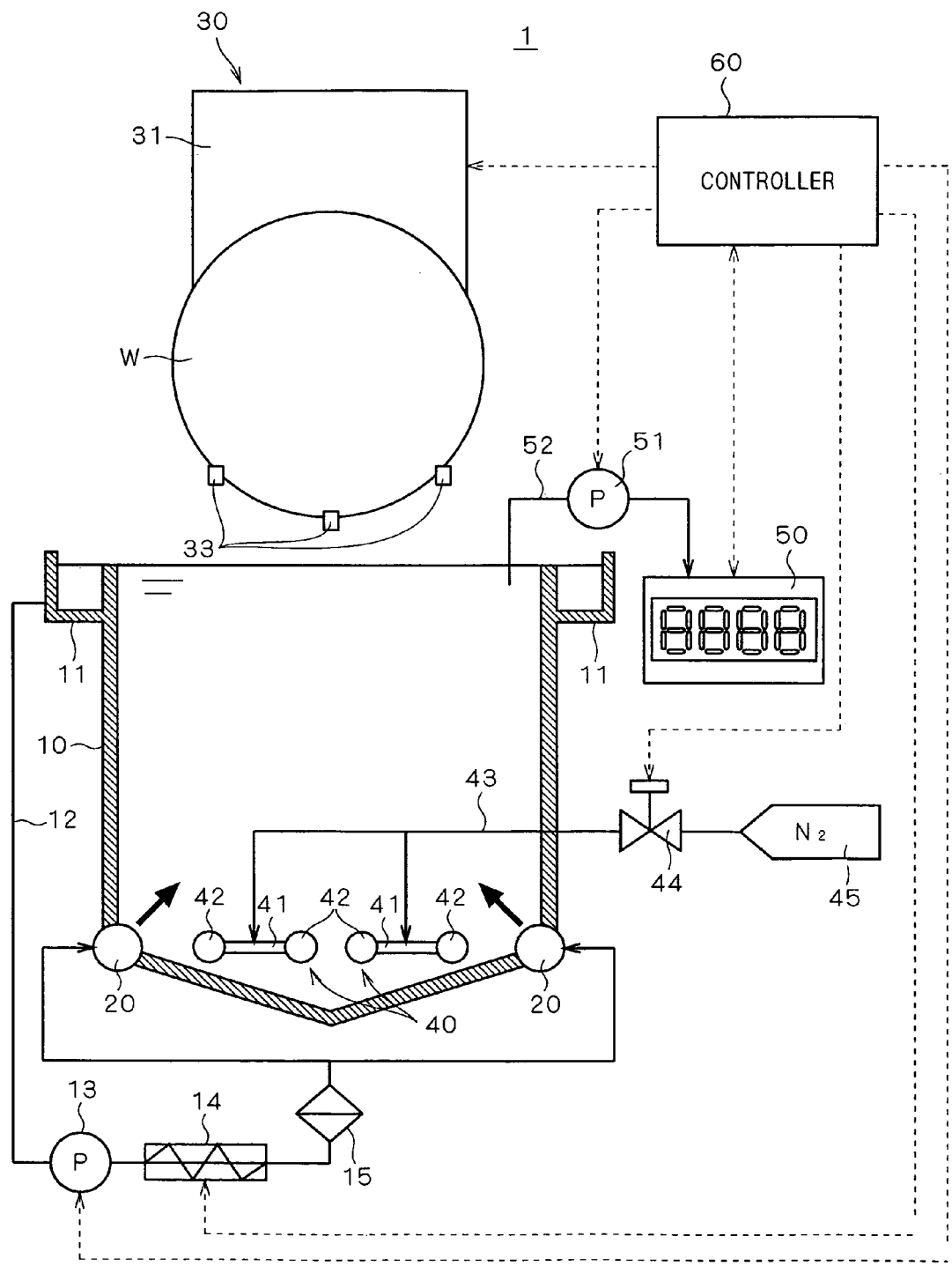
F I G . 1

F I G. 6
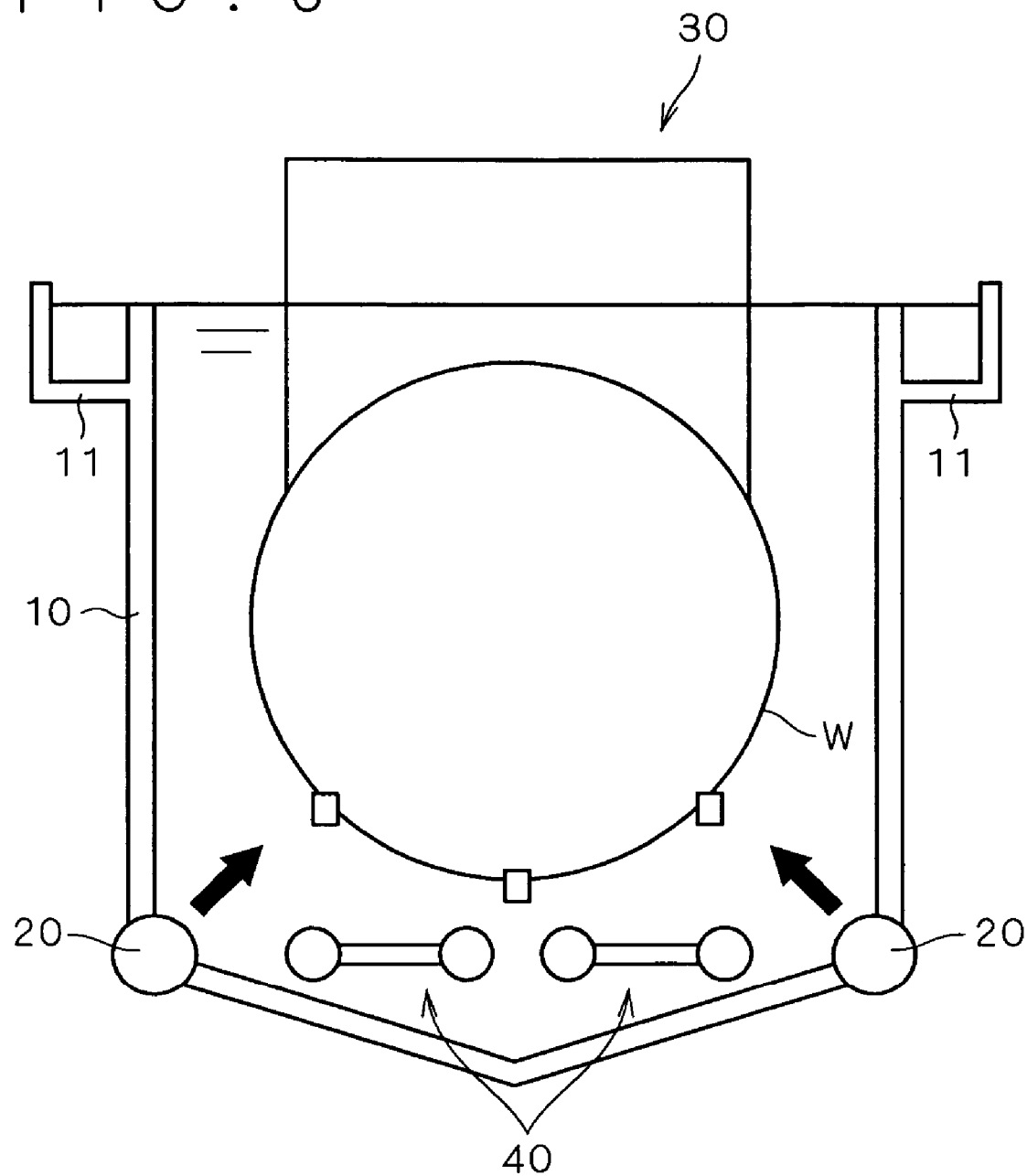

F I G . 7
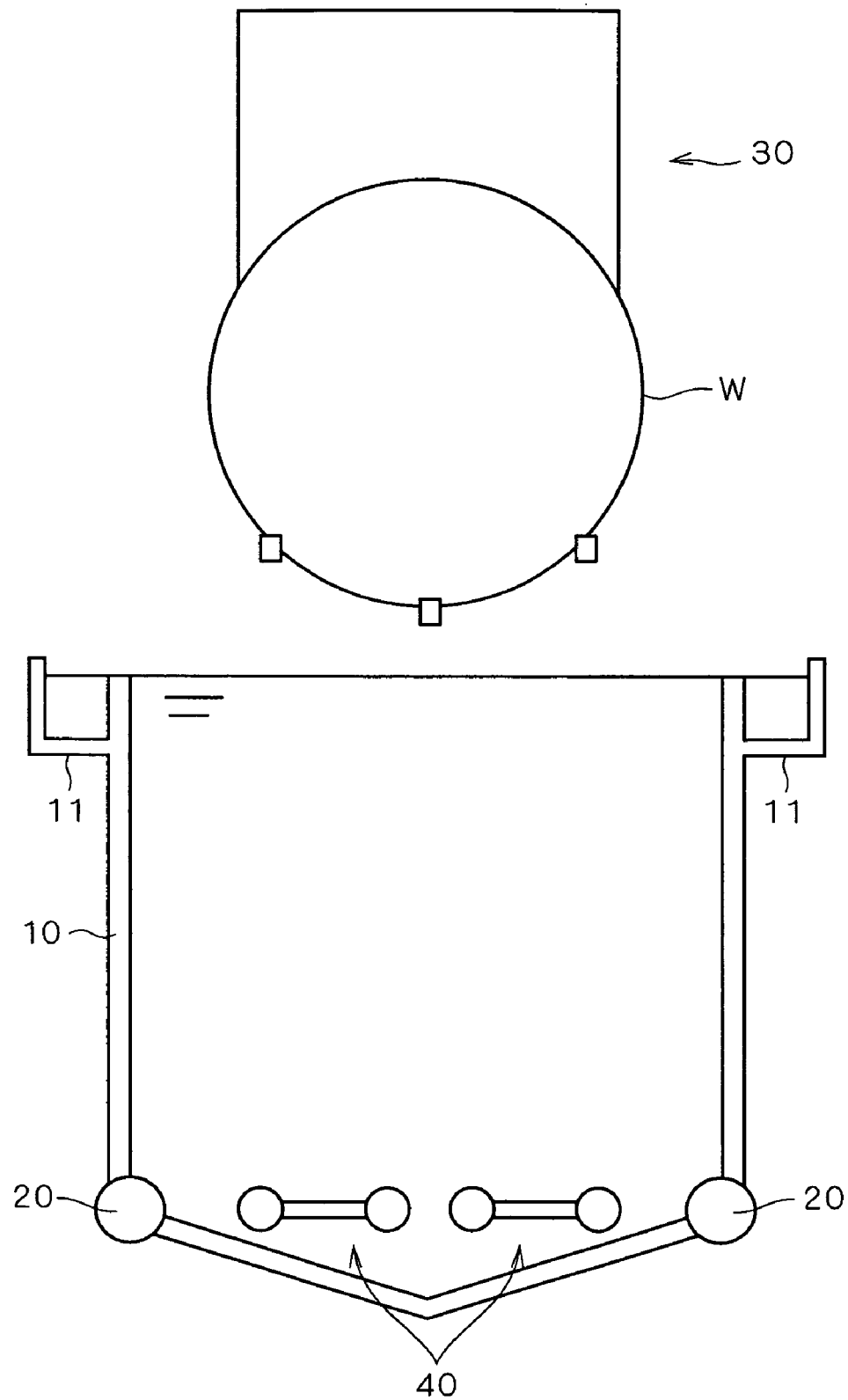

SUBSTRATE PROCESSING APPARATUS AND METHOD OF REMOVING PARTICLES

BACKGROUND OF THE INVENTION

1. Field of the Invention

The present invention relates to a technique for removing particles from a processing tank storing a liquid in a substrate processing apparatus for performing a process by dipping substrates including a semiconductor substrate, a glass substrate for a liquid crystal display, a glass substrate for a photomask and the like in the liquid.

2. Description of the Background Art

Conventionally, a dip-type substrate processing apparatus for processing substrates by dipping the substrates in a liquid such as deionized water and liquid chemicals has been known in the manufacturing steps of the substrates. The dip-type substrate processing apparatus includes a processing tank for storing a liquid, and performs a cleaning process and the like on substrates in the processing tank.

In such a substrate processing apparatus, particles generated within the processing tank are removed during a process of substrates or during a time interval between processes (a time interval between processing a group of substrates and processing a next group of substrates). Typically, the substrate processing apparatus filters a liquid overflowing the top of the processing tank and supplies the liquid again through a bottom portion of the processing tank, thereby to reduce the number of particles within the processing tank.

As discussed above, the conventional particle removal method has used only the action of a circulating liquid flow to carry and remove the particles. However, there is a fixed limit to the efficiency of particle removal because the conventional method depends on only the action of the liquid flow. In recent years, it has been a challenge to further shorten the time required to manufacture the substrates, and an acceptable particle level has become increasingly strict. This necessitates a technique capable of removing particles within the processing tank in a shorter time with efficiency.

SUMMARY OF THE INVENTION

The present invention is intended for a substrate processing apparatus for processing a substrate by using a liquid.

According to the present invention, the substrate processing apparatus comprises: a processing tank for storing a liquid; a movement mechanism for moving a substrate to the processing tank; a bubble supply part for supplying bubbles into the processing tank; a circulation part for circulating a liquid overflowing the top of the processing tank through a filter to the processing tank; and a controller for operating the circulation part and the bubble supply part before the movement mechanism moves the substrate into the processing tank.

The substrate processing apparatus can form a liquid flow and a bubble flow both directed upwardly within the processing tank. Thus, particles are carried to a liquid level by using not only the action of the liquid flow but also the attracting effect and buoyant force of the bubbles. Near the liquid level, the particles are moved with the bubbles outwardly of the processing tank efficiently and are discharged out of the processing tank. Therefore, the substrate processing apparatus removes the particles within the processing tank in a short time with efficiency.

Preferably, the bubble supply part supplies the bubbles from a bottom portion of the processing tank.

This increases the rise speed of the particles entirely within the processing tank.

More preferably, the bubble supply part supplies a greater number of bubbles near a central portion of the processing tank than near a peripheral portion thereof.

This enhances the effect of forcing the particles outwardly of the processing tank.

More preferably, the bubble supply part supplies bubbles of an inert gas.

This avoids chemical influences upon the liquid stored in the processing tank.

According to another aspect of the present invention, the substrate processing apparatus comprises: a processing tank for storing a liquid; a bubble supply part for supplying bubbles into the processing tank; a circulation part for circulating a liquid overflowing the top of the processing tank to the processing tank; and a bubble removal part provided at some midpoint of a path of the circulation part for swirling the liquid to gather the bubbles contained in the liquid in the center of the swirl, thereby removing the bubbles.

Particles within the processing tank are caused to attach to the bubbles, and removed with the bubbles. Thus, the substrate processing apparatus removes the particles within the processing tank in a short time with efficiency. Further, the substrate processing apparatus removes the particles without using a filter to reduce operating burdens caused by a filter replacement operation and the like.

Preferably, the circulation part has at least one first path and a second path, and the circulation part includes the bubble removal part provided at some midpoint of the at least one first path, and a filter provided at some midpoint of the second path. The substrate processing apparatus further comprises a selector for selecting one of the at least one first path and the second path.

This allows the selective use of the removal of the particles with the bubbles and the removal of the particles using the filter, as required.

More preferably, the selector selects the second path while a substrate is being processed by using the liquid stored in the processing tank, and selects the at least one first path prior to the process of the substrate or during a time interval between processes of substrates.

The substrate being processed is not affected by bubbles because no bubbles are generated during the process. Additionally, the frequency of the replacement of the filter is lower than the conventional frequency thereof because the filter is not used prior to the process of the substrate or during the time interval between the processes of the substrates.

More preferably, the selector selects the at least one first path when the liquid stored in the processing tank is a processing liquid for making a surface of the substrate hydrophilic, and selects the second path when the liquid stored in the processing tank is a processing liquid for making the surface of the substrate hydrophobic.

No bubbles are generated when the processing liquid for making the surface of the substrate hydrophobic is used. Thus, there is a slight danger that the substrate is affected by the bubbles. No filter is used when the processing liquid for making the surface of the substrate hydrophilic is used. Thus, the frequency of the replacement of the filter is lower than the conventional frequency thereof.

More preferably, the substrate processing apparatus further comprises an adjustment part for adjusting the amount of liquid to be removed with the bubbles in the bubble removal part.

This minimizes the amount of liquid removed with the bubbles.

More preferably, the substrate processing apparatus further comprises: a measurement part for measuring the amount of liquid to be removed with the bubbles in the bubble removal part; a replenishment part for replenishing the processing tank with the liquid; and a controller for operating the replenishment part based on a result of measurement of the measurement part.

An amount of liquid only removed with the bubbles is replenished. Therefore, the substrate processing apparatus maintains the amount of liquid required for circulation.

More preferably, the at least one first path includes a plurality of first paths, and the plurality of first paths are placed in parallel with each other at some midpoint of the path of the circulation part.

The plurality of first paths remove the bubbles in parallel. This reduces the burdens on each bubble removal part to achieve the removal of the bubbles and the particles more efficiently.

More preferably, the bubble supply part supplies microbubbles or nanobubbles into the processing tank.

The microbubbles or nanobubbles, which are very small in size, have a wide total surface area to cause the particles within the processing tank to attach thereto, thereby removing the particles efficiently.

More preferably, the substrate processing apparatus further comprises a second bubble supply part for supplying bubbles larger in size than the microbubbles or nanobubbles into a liquid flowing into the bubble removal part.

The microbubbles or nanobubbles are caused to coalesce with the larger bubbles, and are removed. Thus, the microbubbles or nanobubbles are removed efficiently.

More preferably, the substrate processing apparatus further comprises an expansion part for expanding the microbubbles or nanobubbles flowing into the bubble removal part.

The microbubbles or nanobubbles are removed efficiently.

More preferably, the bubble supply part includes a condition change part for changing a supply condition of the microbubbles or nanobubbles.

The microbubbles or nanobubbles are adjusted to an optimum size and an optimum supply amount depending on the type of the substrate to be processed and the step of the process.

The present invention is also intended for a method of removing particles.

It is therefore an object of the present invention to provide a technique capable of removing particles within a processing tank in a short time with efficiency in a dip-type substrate processing apparatus.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a vertical sectional view of a substrate processing apparatus taken along a plane parallel to each substrate according to a first preferred embodiment of the present invention;

FIGS. 4 to 7 are views showing the operation according to the first preferred embodiment;

DESCRIPTION OF THE PREFERRED EMBODIMENTS

Preferred Embodiments according to the present invention will now be described with reference to the drawings.

1. First Preferred Embodiment

Figure 2:
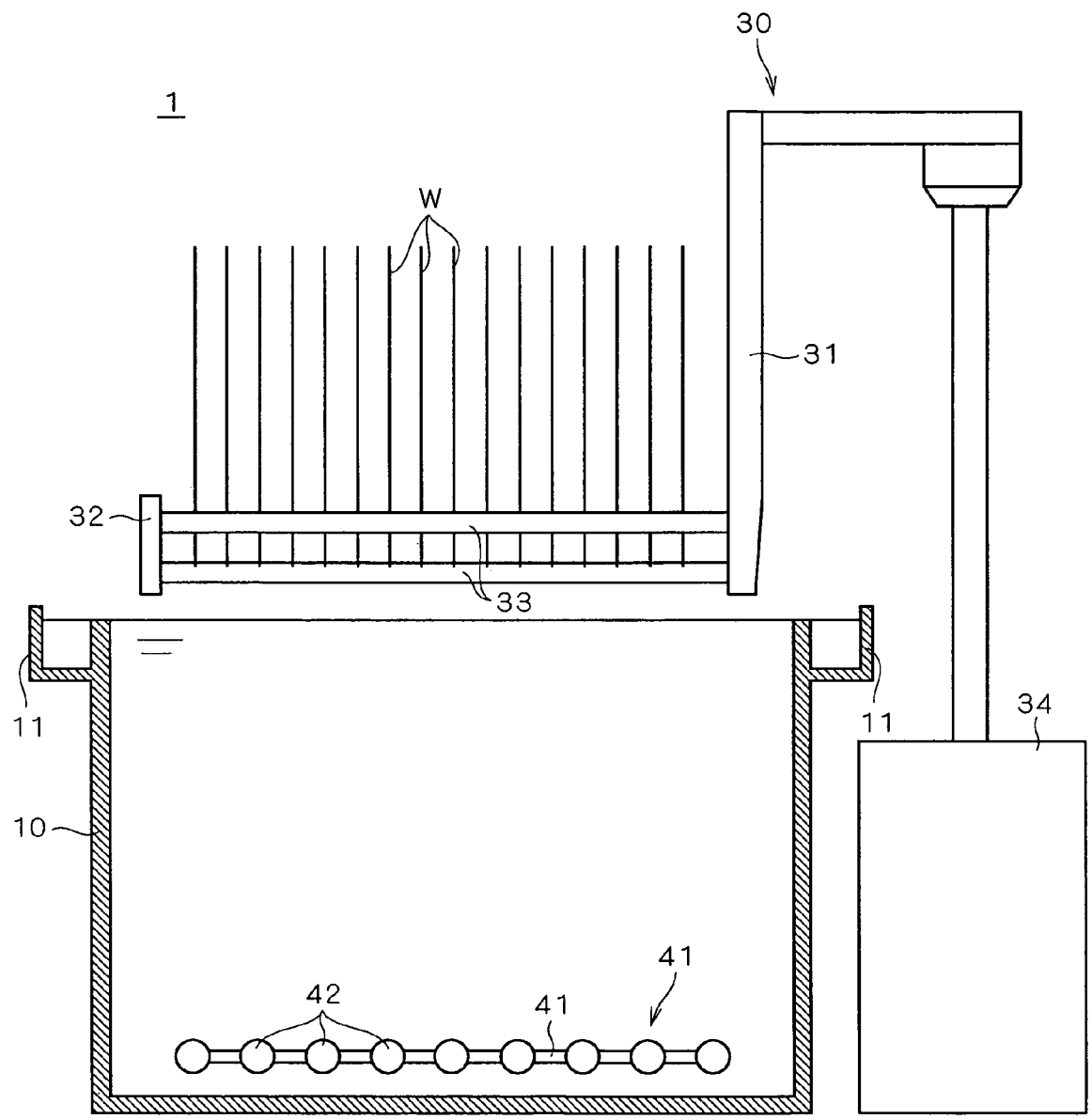
FIG. 2 is a vertical sectional view of the substrate processing apparatus taken along a plane perpendicular to each substrate according to the first preferred embodiment.

FIG. 1 is a vertical sectional view of a substrate processing apparatus 1 taken along a plane parallel to each substrate W according to a first preferred embodiment of the present invention. Piping and a control system are also shown in FIG. 1. FIG. 2 is a vertical sectional view of the substrate processing apparatus 1 taken along a plane perpendicular to each substrate W according to the first preferred embodiment.

As shown in FIGS. 1 and 2, the substrate processing apparatus 1 principally includes a processing tank 10, deionized water discharge parts 20, a lifter 30, a bubbler 40, a particle counter 50, and a controller 60.

The processing tank 10 is a vessel for storing a liquid such as deionized water therein. A process including a cleaning process and the like is performed by dipping substrates W in deionized water stored in the processing tank 10. The processing tank 10 has an open upper surface, and an outer tank 11 is provided on the upper end of the outer side surface of the processing tank 10. Deionized water overflowing the processing tank 10 flows into the outer tank 11, and is then collected into a collection pipe 12.

A pump 13, a heater 14, and a filter 15 are inserted in the pipe 12, and a downstream end of the pipe 12 is coupled to the deionized water discharge parts 20. When the pump 13 is operated, deionized water is fed from the outer tank 11 through the pipe 12 to the deionized water discharge parts 20. The filter 15 removes particles greater than a predetermined size to filter the deionized water. The heater 14 heats the deionized water to be fed to the deionized water discharge parts 20 up to a predetermined temperature.

The deionized water discharge parts 20 provide the deionized water fed from the pipe 12 into the processing tank 10. Because the deionized water discharge parts 20 are provided in a bottom portion of the processing tank 10, the deionized water provided from the bottom portion of the processing tank 10 flows upwardly in the processing tank 10, and then overflows through the opening at the top of the processing tank 10 into the outer tank 11. That is, an upward liquid flow is formed in the processing tank 10.

The lifter 30 includes three holding rods 33 between a lifter head 31 and a holding plate 32. A plurality of holding grooves (not shown) are cut in the holding rods 33. A plurality of substrates W are held in an upright position, with peripheral portions of the respective substrates W freely fitted in the holding grooves of the holding rods 33.

The lifter 30 is connected to a lifter drive part 34 having a servo motor, a timing belt and the like. When the lifter drive part 34 is operated, the lifter 30 moves up and down to reciprocally move the plurality of substrates W between a dip position inside the processing tank 10 and a raised position over the processing tank 10.

The bubbler 40 is provided in the bottom portion of the processing tank 10, and discharges bubbles into the deionized water stored in the processing tank 10. The bubbler 40 includes pipes 41 for passing a gas therethrough, and a plurality of porous discharge parts 42 coupled to downstream ends of the pipes 41 for discharging bubbles. The second ends of the pipes 41 are coupled to a nitrogen source 45 through a pipe 43 and a valve 44. When the valve 44 is opened, a nitrogen gas is supplied from the nitrogen source 45 to discharge bubbles through the pipe 43 out of the discharge parts 42.

The particle counter 50 is a device for measuring the number of particles present in the deionized water. The particle counter 50 takes deionized water in the processing tank 10 through a pump 51 and a pipe 52 to measure the number of particles contained in a predetermined amount of deionized water. The particle counter 50 may be provided as part of the substrate processing apparatus 1 or be a device separate from the substrate processing apparatus 1.

The controller 60 is electrically connected to the lifter drive part 34, the particle counter 50, the pumps 13 and 51, the heater 14, the valve 44 and the like to control the operations of these components. Additionally, the controller 60 receives a result of measurement from the particle counter 50.

Figure 3:
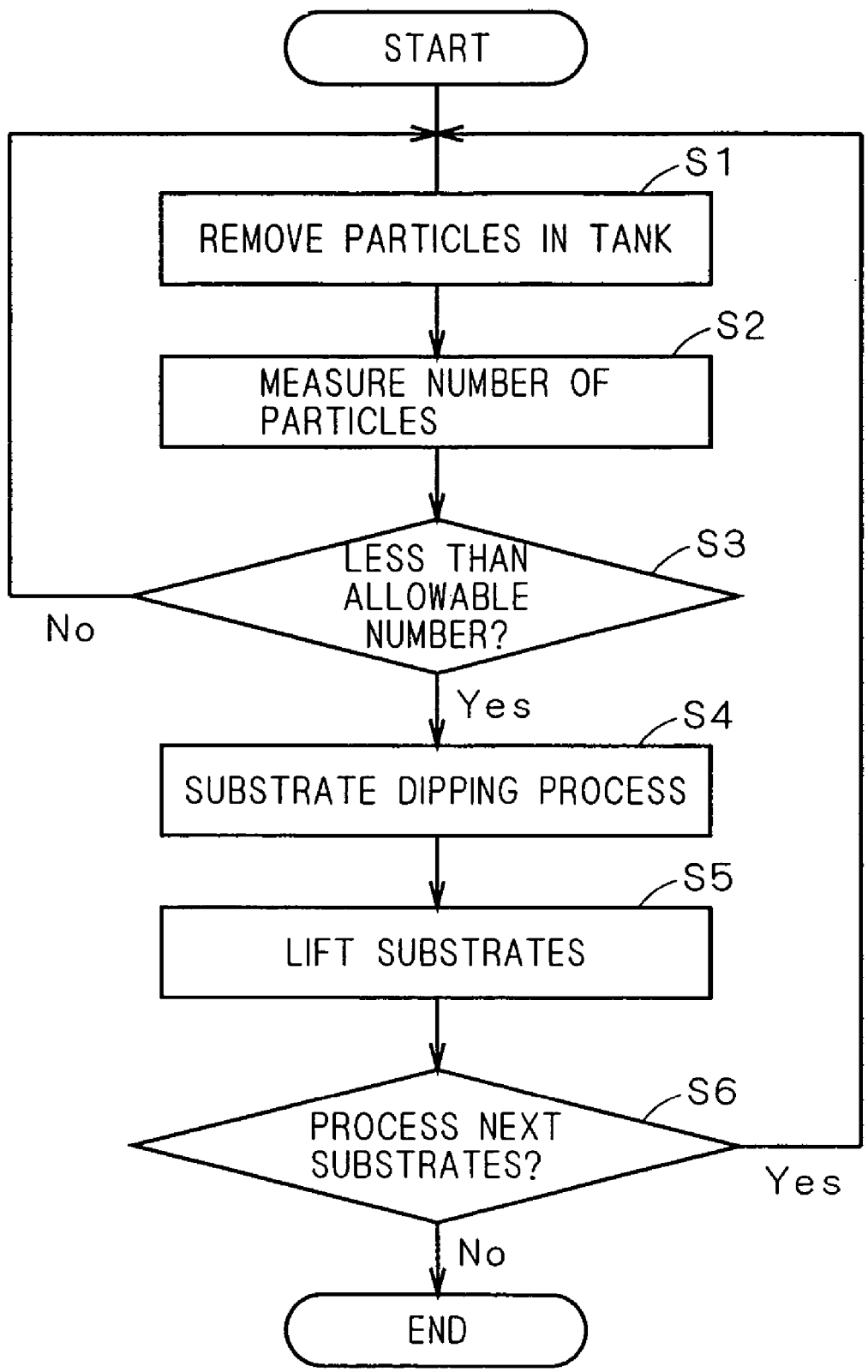
FIG. 3 is a flow chart showing a flow of operation according to the first preferred embodiment.

Next, the operation of the substrate processing apparatus 1 will be described with reference to FIGS. 3 to 7. FIG. 3 is a flow chart showing a flow of operation of the substrate processing apparatus 1. FIGS. 4 to 7 are views showing the operation in respective steps. The controller 60 controls the lifter 30, the particle counter 50, the pumps 13 and 51, the heater 14, the valve 44 and the like, whereby the operation to be described below proceeds.

Figure 4:
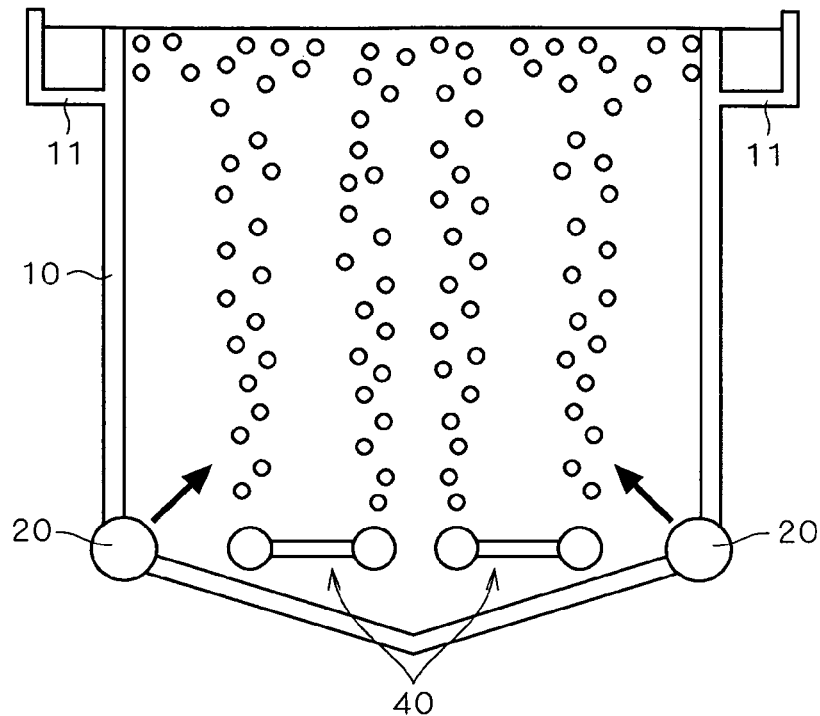

Prior to the process of dipping substrates W, particles in the processing tank 10 are removed (in Step S1) as shown in FIG. 4. Specifically, the pump 13 is operated to circulate the deionized water in the processing tank 10. The deionized water flows upwardly in the processing tank 10, overflows the top of the processing tank 10, and is collected from the outer tank 11 to the pipe 12. Particles are removed while the deionized water passes through the filter 15. The deionized water is discharged again into the processing tank 10.

At this time, the valve 44 is opened to discharge bubbles from the bubbler 40 into the deionized water. The bubbles rise in the deionized water within the processing tank 10 to the surface of the deionized water, and move so as to spread outwardly (toward the outer tank 11) near the surface of the deionized water.

A flow of deionized water and a flow of bubbles are formed in the processing tank 10 as described above in Step S1. Thus, particles are not only carried along upwardly by the flow of deionized water but also attach to the bubbles or are forced upwardly by the buoyant force of the bubbles, thereby being carried upwardly. The particles reaching the vicinity of the liquid level move so as to spread outwardly with the bubbles, and are discharged from the top of the processing tank 10 into the outer tank 11 with efficiency.

Figure 5:
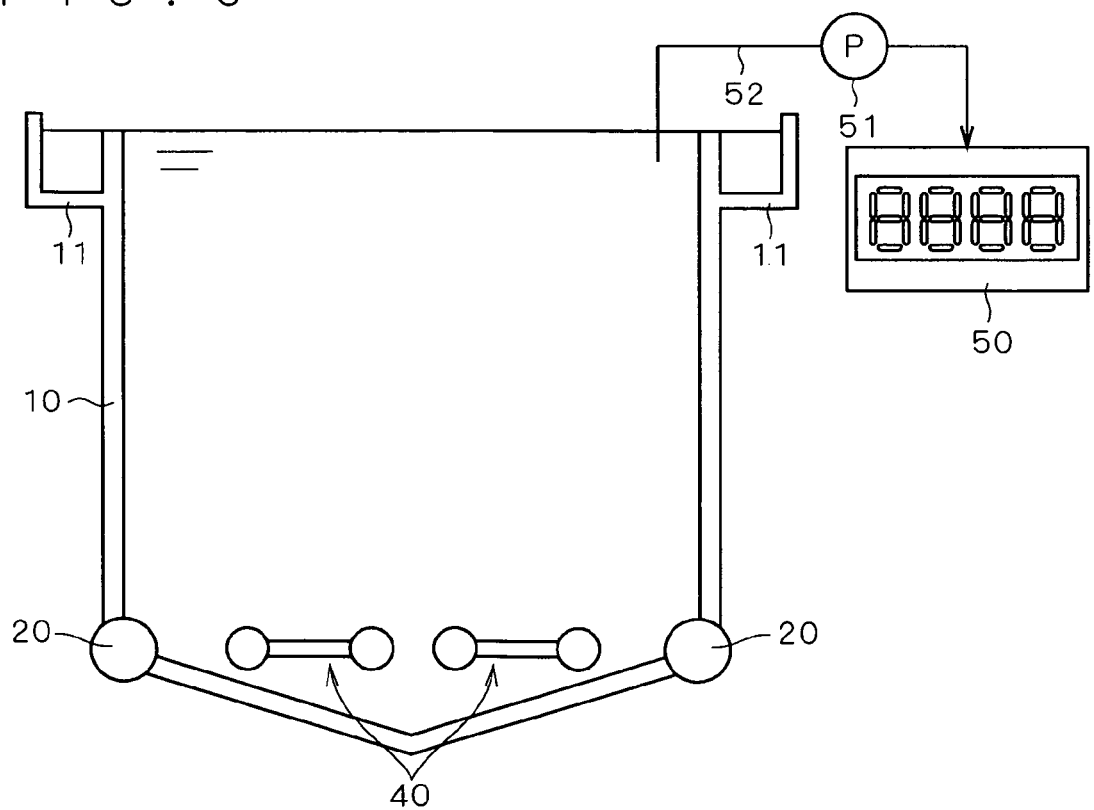

After the state in Step S1 is maintained for a predetermined length of time, the pump 13 is stopped and the valve 44 is closed to stop the circulation of the deionized water and the supply of the bubbles. Then, the pump 51 is operated to take deionized water in the processing tank 10 into the particle counter 50. The particle counter 50 measures the number of particles contained in a unit amount of deionized water taken thereinto (in Step S2), as shown in FIG. 5.

The result of measurement in the particle counter 50 is sent from the particle counter 50 to the controller 60. The controller 60, which previously stores the allowable number of particles, i.e. a threshold value, for the start of the dipping process in the processing tank 10, makes a comparison between the allowable number and the received result of measurement (in Step S3). If the result of measurement is not less than the allowable number, the processing returns to Step S1 for the further execution of the process of removing the particles. If the result of measurement is less than the allowable number, it is judged that the particles are sufficiently removed from within the processing tank 10, and the process of dipping the substrates W is started.

Figure 8:
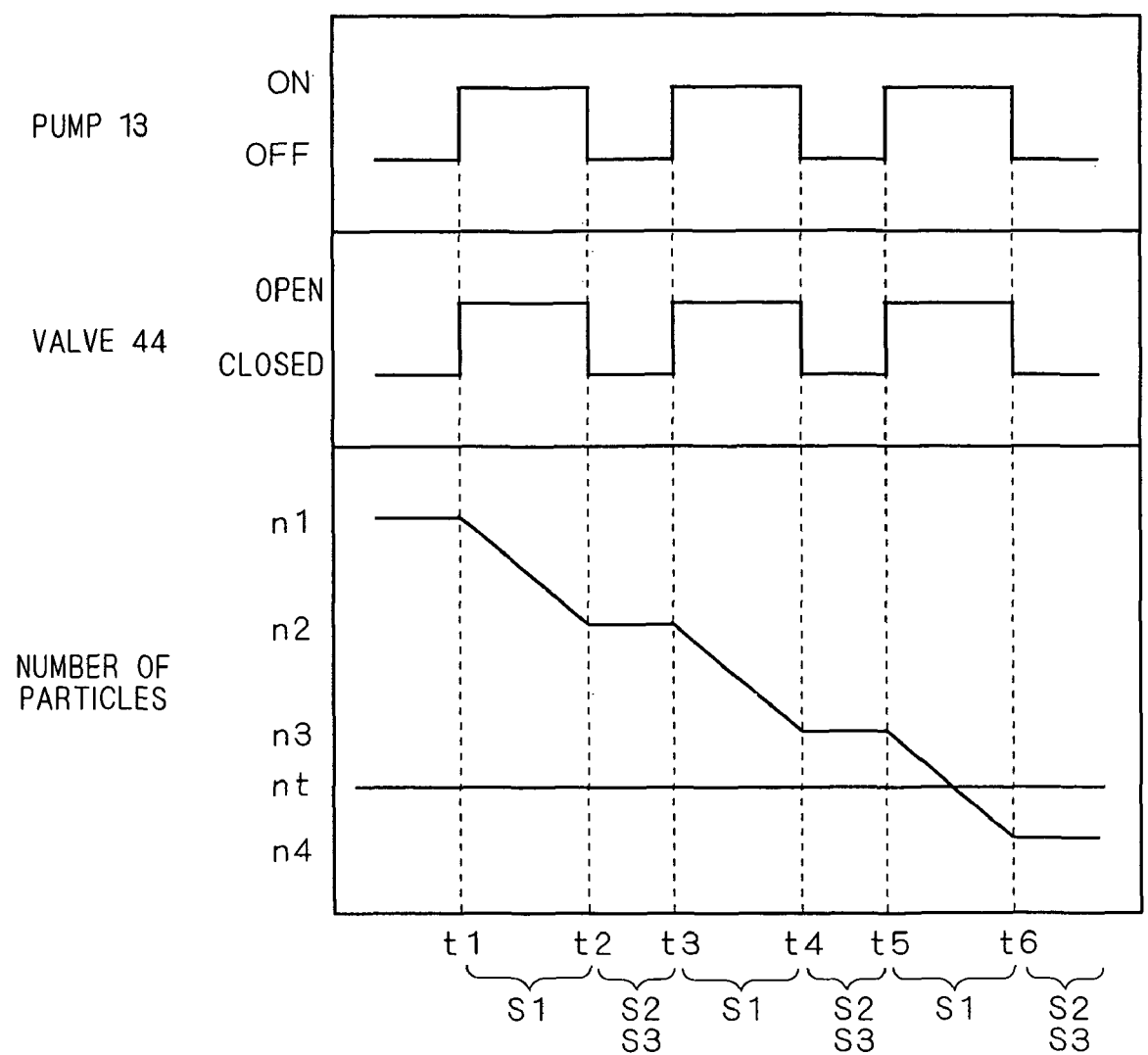
FIG. 8 shows the state of a pump, the position of a valve, and a change in the number of particles.

FIG. 8 shows the state of the pump 13, the position of the valve 44, and a change in the number of particles contained in a predetermined amount of deionized water within the processing tank 10 in Steps S1 to S3. The abscissa of FIG. 8 is common and represents time.

In the instance shown in FIG. 8, the initial number of particles equals n1. At time t1, the pump 13 is operated and the valve 44 is opened. Then, the above-mentioned effect decreases the number of particles within the processing tank 10 (in Step S1). At time t2 which is a predetermined amount of time later than the time t1, the valve 44 is closed and the pump 13 is stopped. Then, the number of particles is measured and compared with the allowable number nt (in Steps S2 and S3). At this point, the number of particles equals n2 which is not less than the allowable number nt. Accordingly, the pump 13 is operated and the valve 44 is opened again. Thus, the process of removing the particles within the processing tank 10 is performed (in Step S1). In this manner, Steps S1 to S3 are repeated a plurality of times (in this instance, three times) until the number of particles falls below the allowable number nt.

The number of particles measured after time t6 equals n4 and first falls below the allowable number nt. Accordingly, the processing does not return to the process of removing the particles but proceeds to the process of dipping the substrates W after the time t6. Such a technique allows the processing to proceed to the process of dipping the substrates W as soon as the number of particles within the processing tank 10 falls below the allowable number.

The process of dipping the substrates W is performed by storing a predetermined liquid chemical or deionized water in the processing tank 10 and dipping the substrates W therein (in Step S4), as shown in FIG. 6. A process including an etching process, a water rinse process or the like is performed in the processing tank 10. The dipping process is performed in some cases while the pump 13 is operated to discharge the deionized water from the deionized water discharge parts 20, thereby circulating the deionized water in the processing tank 10.

After the completion of the process of dipping the substrates W, the lifter 30 is moved upwardly to lift the substrates W (in Step S5), as shown in FIG. 7. Thereafter, the substrates W are transported to another apparatus, and the substrate processing apparatus 1 completes the process on the single group of substrates W. The substrates W either in the state shown in FIG. 7 or after being transported to another apparatus are subjected to a drying process.

After the completion of the process of the single group of substrates W, a judgment is made as to whether to process a next group of substrates W or not (in Step S6). If the next process is judged to be executed, the processing returns to Step S1 for the execution of the process of removing the particles remaining in the processing tank 10.

As described hereinabove, the substrate processing apparatus 1 not only forms a liquid flow directed upwardly within the processing tank 10 but also supplies bubbles to remove particles. Thus, the particles attach to the bubbles or are forced upwardly by the buoyant force of the bubbles, thereby being carried upwardly. The particles near the liquid level move so as to spread outwardly with the bubbles, and are discharged outwardly from the processing tank 10 with efficiency. The substrate processing apparatus 1 therefore can remove particles within the processing tank 10 in a short time with efficiency.

To increase the rise speed of the particles entirely within the processing tank 10, it is desirable that the bubbles be supplied from the bottom portion of the processing tank 10 as described above. To enhance the effect of forcing the particles outwardly of the processing tank 10, it is desirable that a greater number of bubbles be supplied near the central portion of the processing tank 10 than near the peripheral portion thereof.

Although deionized water is stored in the processing tank 10 in the above-mentioned substrate processing apparatus 1, the liquid stored in the processing tank 10 may be a processing liquid other than the deionized water. Although the bubbles of the nitrogen gas are supplied in the above-mentioned substrate processing apparatus 1, the gas used for the bubbles may be a gas other than the nitrogen gas. It is, however, desirable to use an inert gas such as the nitrogen gas for the purpose of avoiding chemical influences upon the liquid stored in the processing tank 10.

The above-mentioned substrate processing apparatus 1 performs the particle removal process each time a group of substrates are subjected to the dipping process. The frequency of the particle removal process, however, may be once every plurality of number of times of the dipping process.

The above-mentioned substrate processing apparatus 1 repeats Steps S1 to S3 until the number of particles falls below the allowable number. This makes it possible to measure the net time for the particle removal process required until the number of particles falls below the allowable number. In the instance shown in FIG. 8, for example, the actual operation time for the particle removal process is given by (t2–t1)+(t4–t3)+(t6–t5). Once the actual operation time is determined, Steps S1 to S3 need not be repeated but instead Step S1 may be executed continuously for the above-mentioned time or longer.

2. Second Preferred Embodiment

Figure 9:
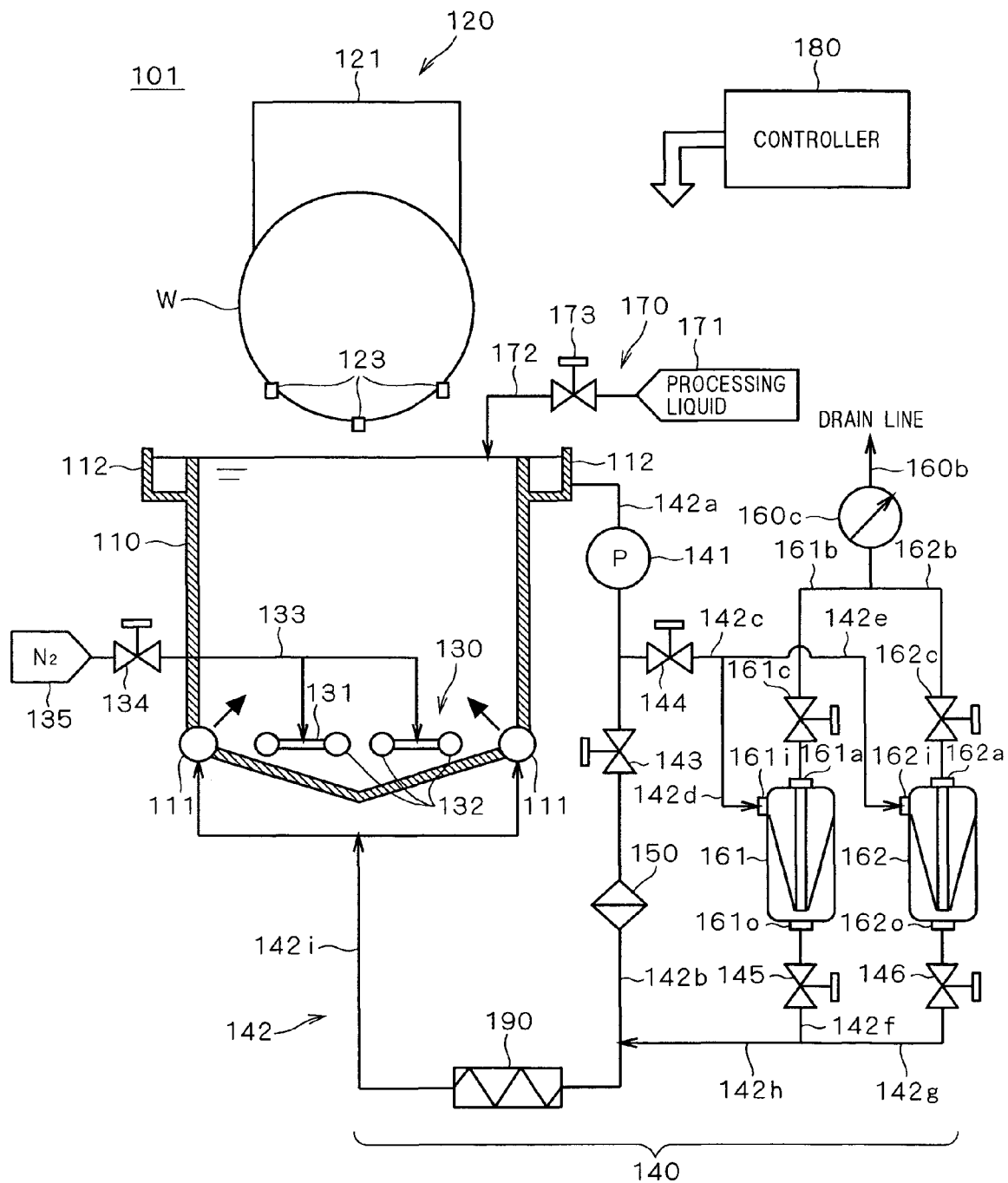
FIG. 9 is a vertical sectional view of the substrate processing apparatus taken along a plane parallel to each substrate according to a second preferred embodiment of the present invention.
Figure 10:
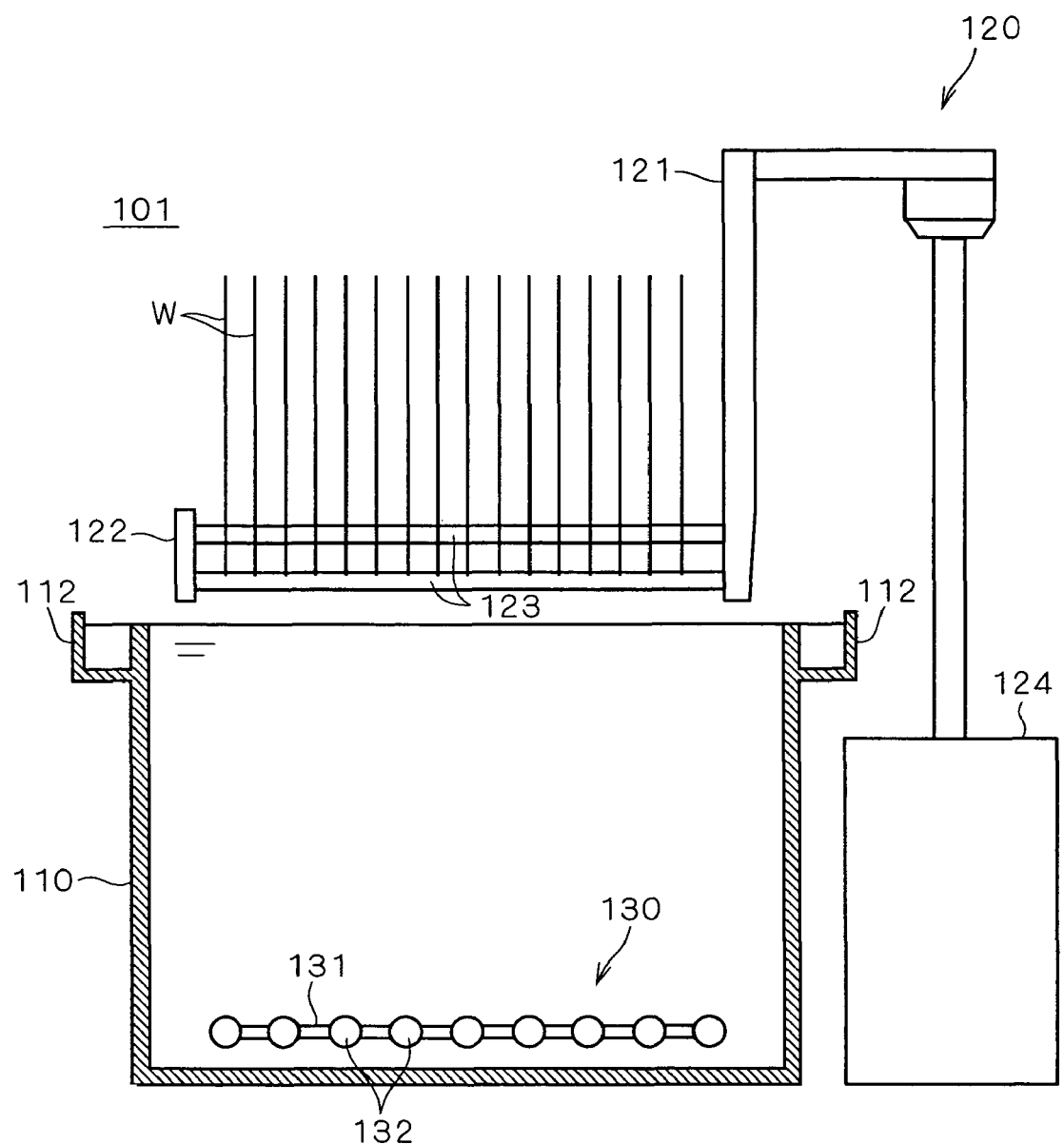
FIG. 10 is a vertical sectional view of the substrate processing apparatus taken along a plane perpendicular to each substrate according to the second preferred embodiment.

FIG. 9 is a vertical sectional view of a substrate processing apparatus 101 taken along a plane parallel to each substrate W according to a second preferred embodiment of the present invention. Piping and a control system are also shown in FIG. 9. FIG. 10 is a vertical sectional view of the substrate processing apparatus 101 taken along a plane perpendicular to each substrate W according to the second preferred embodiment.

As shown in FIGS. 9 and 10, the substrate processing apparatus 101 principally includes a processing tank 110, a lifter 120, a bubbler 130, a circulation system 140, a filter 150, bubble removal parts 161 and 162, a processing liquid supply system 170, and a controller 180.

The processing tank 110 is a vessel for storing a processing liquid such as deionized water therein. A process including a cleaning process and the like is performed by dipping substrates W in the processing liquid stored in the processing tank 110. Processing liquid discharge parts 111 are provided in a bottom portion of the processing tank 110, and the processing liquid is supplied from the processing liquid discharge parts 111 into the processing tank 110. The processing tank 110 has an open upper surface, and an outer tank 112 is provided on the upper end of the outer side surface of the processing tank 1110. Deionized water supplied from the processing liquid discharge parts 111 flows upwardly in the processing tank 110, and then overflows through the opening at the top of the processing tank 110 into the outer tank 112.

The lifter 120 includes three holding rods 123 between a lifter head 121 and a holding plate 122. A plurality of holding grooves (not shown) are cut in the holding rods 123. A plurality of substrates W are held in an upright position in the holding grooves of the holding rods 123.

The lifter 120 is connected to a lifter drive part 124 having a servo motor, a timing belt and the like. When the lifter drive part 124 is operated, the lifter 120 moves up and down to reciprocally move the plurality of substrates W between a dip position inside the processing tank 110 and a raised position over the processing tank 110. For processing the substrates W using the processing liquid in the processing tank 110, the lifter 120 is moved down to dip the substrates W in the processing liquid within the processing tank 110. During a time interval between processing a group of substrates W and processing a next group of substrates W, the lifter 120 is held in the raised position.

The bubbler 130 is provided in the bottom portion of the processing tank 110, and discharges bubbles into the processing liquid stored in the processing tank 10. The bubbler 130 includes pipes 131 for passing a gas therethrough, and a plurality of porous discharge parts 132 coupled to downstream ends of the pipes 131 for discharging bubbles. The second ends of the pipes 131 are coupled to a nitrogen source 135 through a pipe 133 and a valve 134. When the valve 134 is opened, a nitrogen gas is supplied from the nitrogen source 135 to discharge nitrogen gas bubbles out of the discharge parts 132 into the processing liquid.

The circulation system 140 includes a pump 141 and piping 142, and feeds the processing liquid overflowing the top of the processing tank 110 back into the processing liquid discharge parts 111. The piping 142 includes a plurality of pipes 142a to 142i to feed the processing liquid through a plurality of paths back into the processing liquid discharge parts 111. The pipe 142a has a first end coupled to the outer tank 112, with the pump 141 inserted therein, and branches at its second end into the two pipes 142b and 142c. A valve 143 and the filter 150 are inserted in the pipe 142b. A valve 144 is inserted in the pipe 142c which in turn branches at its downstream end into the two pipes 142d and 142e. The pipes 142d and 142e are coupled to inlets 161i and 162i of the bubble removal parts 161 and 162, respectively. The pipes 142f and 142g are coupled to processing liquid outlets 161o and 162o of the bubble removal parts 161 and 162, respectively. Valves 145 and 146 are inserted in the pipes 142f and 142g, respectively. The pipes 142f and 142g are joined at their downstream ends to the single pipe 142h. The pipe 142b and the pipe 142h are joined to the single pipe 142i which in turn is coupled through a heater 190 to the processing liquid discharge parts 111.

In such a circulation system 140, the processing liquid is circulated by way of the filter 150 when the valve 144 is closed, the valve 143 is opened and the pump 141 is operated. The processing liquid is circulated by way of the bubble removal parts 161 and 162 when the valve 143 is closed, the valves 144, 145 and 146 are opened and the pump 141 is operated.

Figure 11:
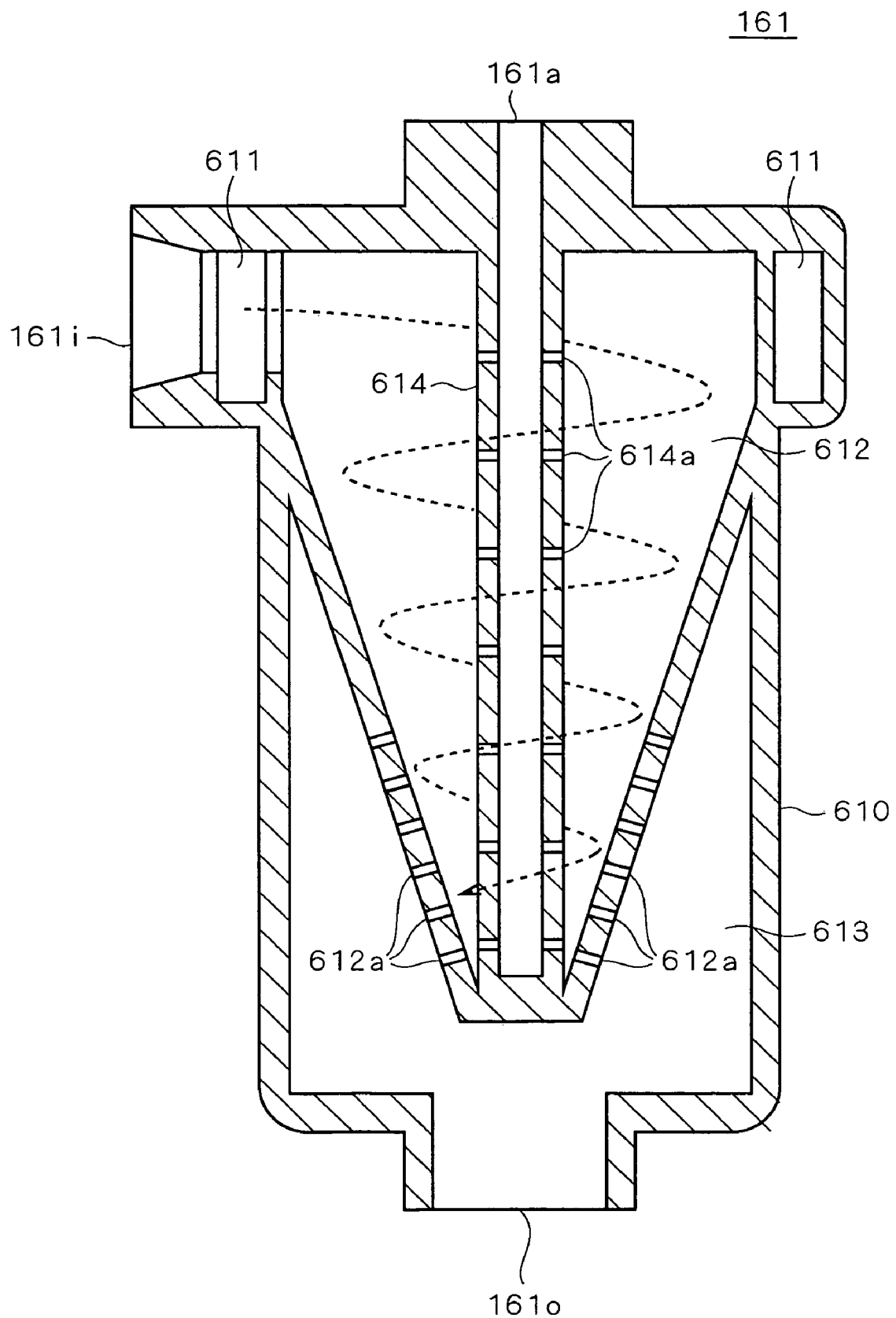
FIG. 11 is a vertical sectional view showing a construction of a bubble removal part.

Each of the bubble removal parts 161 and 162 is a device for swirling the processing liquid to gather the bubbles contained in the processing liquid toward the center of the swirl, thereby removing the bubbles. The bubble removal parts 161 and 162 are identical in construction with each other, and the construction of only the bubble removal part 161 is shown in FIG. 11. As shown in FIG. 11, the bubble removal part 161 includes a substantially cylindrical case 610 in which are provided a pre-swirling flow chamber 611, a swirling flow chamber 612, a filtrate chamber 613, and a bubble removal tube 614. The pre-swirling flow chamber 611 is formed to surround an upper portion of the case 610. The swirling flow chamber 612 has a conic configuration tapering downwardly and is formed inside the pre-swirling flow chamber 611.

The processing liquid introduced through the inlet 161i makes a revolution within the pre-swirling flow chamber 611, and then flows into the swirling flow chamber 612 in the form of a swirling flow advancing in a direction tangential to the case 610. In the swirling flow chamber 612, the processing liquid flows downwardly while swirling along the side surface of the swirling flow chamber 612. In this process, the liquid having a higher density is gathered in a peripheral portion of the swirling flow chamber 612 and the bubbles having a lower density are gathered in a central portion thereof by centrifugal force (the principle of a cyclone).

A plurality of small holes 612a are formed between the swirling flow chamber 612 and the filtrate chamber 613. Thus, the processing liquid gathered in the peripheral portion of the swirling flow chamber 612 is introduced through the small holes 612a into the filtrate chamber 613, and is then emitted through the processing liquid outlet 161o into the pipe 142f.

A plurality of small holes 614a are also formed between the swirling flow chamber 612 and the bubble removal tube 614. Thus, the bubbles gathered in the central portion of the swirling flow chamber 612 are introduced with a small amount of processing liquid through the small holes 614a into the bubble removal tube 614, and are then emitted through a bubble outlet 161a.

The bubble removal part 161 having such a construction and the bubble removal part 162 having a similar construction are placed in parallel with each other in this substrate processing apparatus 101. This reduces the burdens on each of the bubble removal parts to achieve the removal of the bubbles more efficiently.

Referring again to FIG. 9, pipes 161b and 162b are coupled to the bubble outlets 161a and 162a of the bubble removal parts 161 and 162, respectively. The pipes 161b and 162b are joined to a single pipe 160b having a downstream end leading to a drain line. The bubbles emitted through the bubble outlets 161a and 162a pass with a small amount of processing liquid through the pipes 161b, 162b and 160b to the drain line.

Variable flow valves 161c and 162c are inserted in the pipes 161b and 162b, respectively, to adjust the amount of processing liquid to be drained with the bubbles. A flow meter 160c is inserted in the pipe 160b to measure the amount of processing liquid drained with the bubbles.

The processing liquid supply system 170 includes a processing liquid source 171, a pipe 172 for connection between the processing tank 110 and the processing liquid source 171, and a valve 173 inserted in the pipe 172. Thus, the processing liquid is supplied from the processing liquid source 171 to the processing tank 110 by opening the valve 173.

The controller 180 is electrically connected to the lifter drive part 124, the pump 141, the heater 190, and the valves 134, 143 to 146, 161c, 162c and 173 to control the operations of these components. Additionally, the controller 180 receives a result of measurement from the flow meter 160c.

Figure 12:
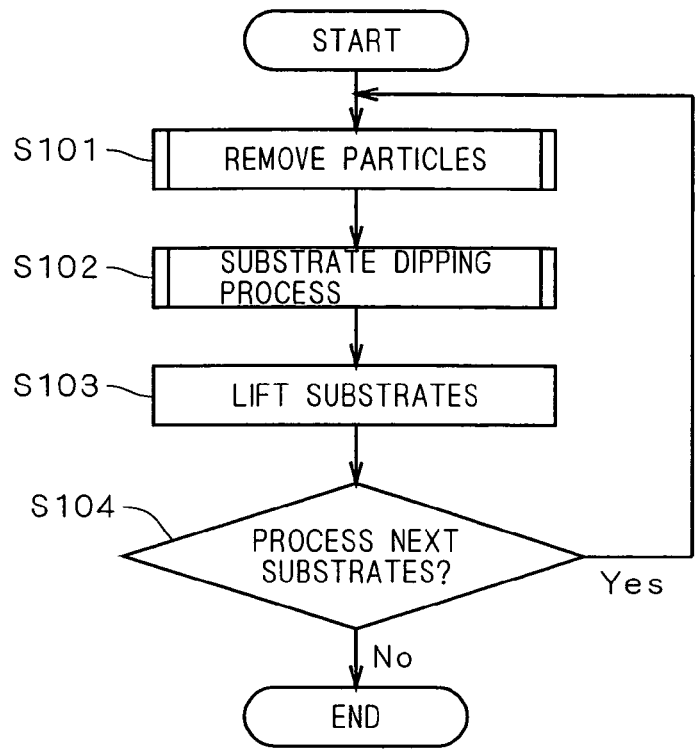
FIG. 12 is a flow chart showing a flow of operation according to the second preferred embodiment.

Next, the operation of the substrate processing apparatus 101 will be described. FIG. 12 is a flow chart showing a flow of operation of the substrate processing apparatus 101. The controller 180 controls the lifter 120, the pump 141, the heater 190, the valves 143 to 146 and 173, the variable flow valves 161c and 162c, and the like, whereby the operation to be described below proceeds.

Prior to the process of dipping substrates W, particles in the processing tank 110 are removed (in Step S101). At this time, an amount of processing liquid sufficient to circulate in the circulation system 140 is previously stored in the processing tank 110.

Figure 13:
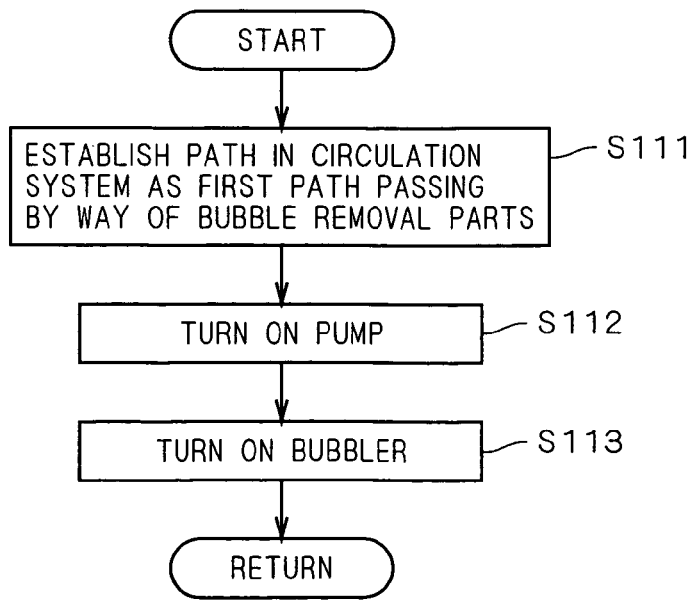
FIG. 13 is a flow chart showing a flow of operation in a particle removal step.

FIG. 13 is a flow chart showing the operation in the particle removal step in Step S101. First, the valve 143 is closed and the valves 144 to 146 are opened in the particle removal step. This establishes the path in the circulation system 140 as a first path passing by way of the bubble removal parts 161 and 162 (in Step S111). Next, the pump 141 is operated to circulate the processing liquid by way of the bubble removal parts 161 and 162 (in Step S112). Then, the valve 134 is opened to supply bubbles from the bubbler 130 (in Step S113).

A flow of processing liquid directed upwardly of the processing tank 110 is formed in the processing tank 110, and the bubbles from the bubbler 130 rise upwardly of the processing tank 110 in the flow of processing liquid. Thus, particles remaining in the processing tank 110 attach to the bubbles and are carried upwardly of the processing tank 110 with the bubbles. The processing liquid containing the bubbles and the particles overflows the top of the processing tank 110 into the outer tank 112, and flows into the circulation system 140.

Thereafter, the processing liquid passes through the pipes 142a, 142c, 142d and 142e, and is introduced through the inlets 161i and 162i into the bubble removal parts 161 and 162. In the bubble removal parts 161 and 162, the processing liquid is swirled as described above, and the bubbles in the processing liquid are gathered toward the center of the swirl and removed. In this process, the particles attaching to the bubbles are also removed with the bubbles. The bubbles and particles removed in the bubble removal parts 161 and 162 are emitted with a small amount of processing liquid from the bubble outlets 161a and 162a through the pipes 161b and 162b and the pipe 160b into the drain line.

The processing liquid after the removal of the bubbles is discharged through the processing liquid outlets 161o and 162o to the pipes 142f and 142g. The processing liquid through the pipe 142f and the processing liquid through the pipe 142g are joined together into the pipe 142h. Thereafter, the processing liquid passes through the pipe 142i, and is fed again from the processing liquid discharge parts 111 into the processing tank 110.

The amount of processing liquid circulating gradually decreases because a small amount of processing liquid is drained with the bubbles in the bubble removal parts 161 and 162. Thus, the variable flow valves 161c and 162c provided on the bubble discharge sides of the bubble removal parts 161 and 162 are adjusted to a minimum level required for the removal of the bubbles. Further, the flow meter 160c measures the amount of drained processing liquid, and the valve 173 is opened based on the result of the measurement, thereby to replenish an insufficient amount of processing liquid.

Referring again to FIG. 12, the above-mentioned circulation by way of the bubble removal parts 161 and 162 is continued for a predetermined length of time to sufficiently remove the particles with the bubbles in Step S101. After the completion of the removal of the particles, the bubbler 130 and the pump 141 are stopped. Next, the process of dipping the substrates W is performed (in Step S102).

Figure 14:
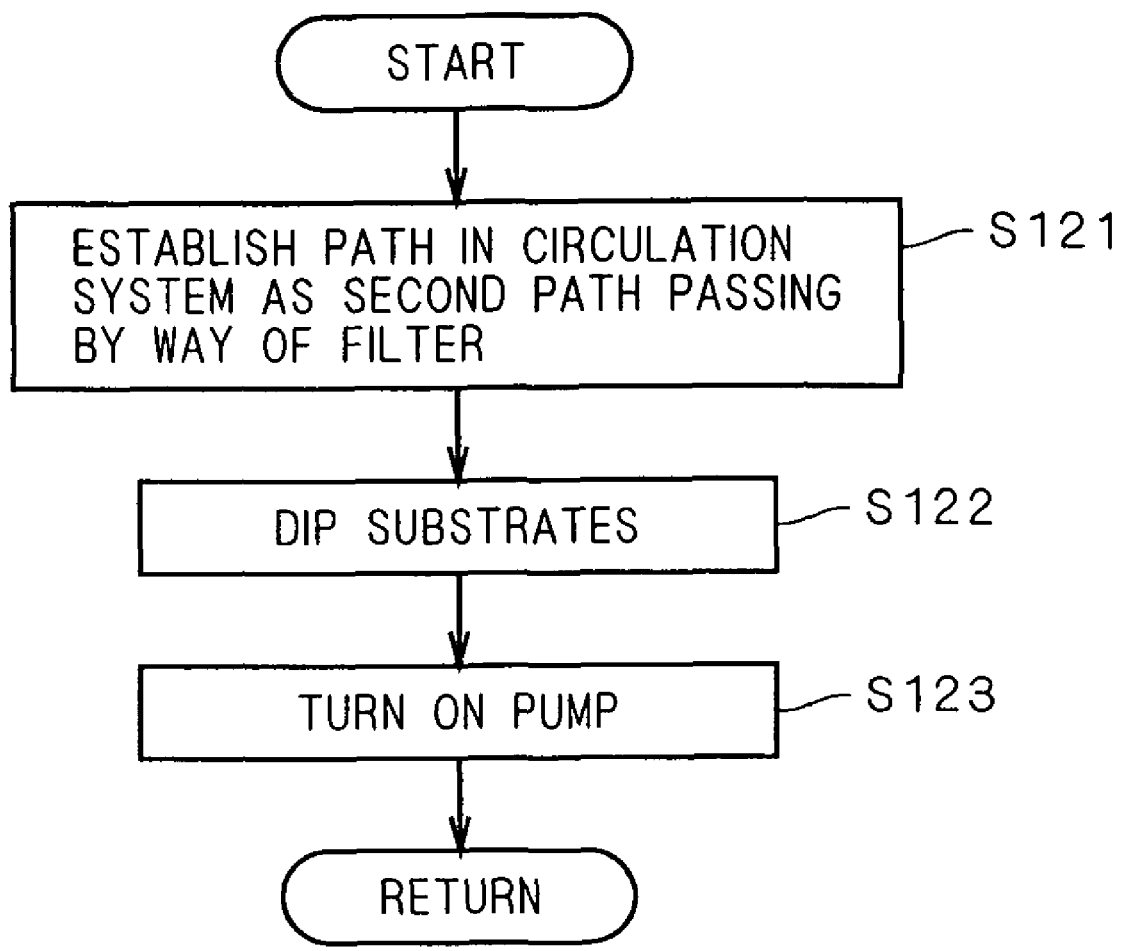
FIG. 14 is a flow chart showing a flow of operation in a dipping process step.

FIG. 14 is a flow chart showing the operation in the dipping process in Step S102. First, the valve 144 is closed and the valve 143 is opened in the process of dipping the substrates W. This establishes the path in the circulation system 140 as a second path passing by way of the filter 150 (in Step S121). Next, the lifter drive part 124 is operated to dip the substrates W into the processing tank 110 (in Step S122). Then, the pump 141 is operated to circulate the processing liquid by way of the filter 150 (in Step S123).

A process using the processing liquid, i.e. an etching process, a cleaning process or the like, is performed on the substrates W in the processing tank 110. In this process, the particles generated in the processing tank 110 are carried along upwardly of the processing tank 110 by the flow of processing liquid, and overflow with the processing liquid into the outer tank 112. The processing liquid passes through the pipes 142a, 142b and 142i, and is fed again from the processing liquid discharge parts 111 into the processing tank 110. The particles are removed by the filter 150 provided at some midpoint of the second path. In Step S102, such circulation by way of the filter 150 is performed to remove the particles generated during the process at any time.

Referring again to FIG. 12, after the completion of the process of dipping the substrates W, the lifter 120 is moved upwardly to lift the substrates W (in Step S103). Thereafter, the substrates W are transported to another apparatus, and the process of the single group of substrates W in the substrate processing apparatus 101 is completed. The drying process is performed on the substrates W either while the substrates W are in the raised position in the substrate processing apparatus 101 or after the substrates W are transported to another apparatus.

After the completion of the process of the single group of substrates W, an operator or the controller 180 makes a judgment as to whether to process a next group of substrates W or not (in Step S104). If the next process is judged to be executed, the processing returns to Step S101 for the execution of the process of removing the particles remaining in the processing tank 110.

As described hereinabove, the substrate processing apparatus 101 removes the particles by using the filter 150 during the process of dipping the substrates W, and removes the particles by using the bubbler 130 and the bubble removal parts 161 and 162 prior to the process of dipping the substrates W or during a time interval between processing a group of substrates W and processing a next group of substrates W. Thus, the bubbler 130 is not operated during the process to prevent the bubbles from exerting adverse effect on the substrates W. Additionally, the frequency of the replacement of the filter in the second preferred embodiment is lower than that in the background art because the filter is not used during the time interval between the processes.

As described above, the substrate processing apparatus 101 supplies bubbles into the processing tank 110, and removes the bubbles by using the bubble removal parts 161 and 162. This allows the particles in the processing tank 110 to attach to the bubbles and to be removed with the bubbles. Therefore, the substrate processing apparatus 101 can remove the particles without using the filter to reduce operating burdens caused by a filter replacement operation and the like. Additionally, the decrease in availability factor of the substrate processing apparatus 101 is prevented.

The circulation system 140 has the first path passing by way of the bubble removal parts 161 and 162, and the second path passing by way of the filter 150, and can make a selection between the first and second paths by opening and closing the valves 143 to 146. This allows the selective use of the removal of the particles using the bubble removal parts 161 and 162 and the removal of the particles using the filter 150, as required.

In the above-mentioned instance, the second path passing by way of the filter 150 is used during the process of dipping the substrates W whereas the first path passing by way of the bubble removal parts 161 and 162 is used prior to the process of dipping a group of substrates W or during the time interval between processing a group of substrates W and processing a next group of substrates W. This prevents the bubbles from exerting the adverse effect on the substrates W being processed. However, the substrates W are affected by the bubbles principally when the substrates W are processed by using a processing liquid (e.g., hydrofluoric acid) for making the surfaces of the substrates W hydrophobic. Thus, the bubbler 130 may be operated and the first path passing by way of the bubble removal parts 161 and 162 be used if the substrates W are processed by using a processing liquid (e.g., SC1) for making the surfaces of the substrates W hydrophilic. That is, the circulation system 140 may be adapted to use the second path passing by way of the filter 150 when the processing liquid for making the surfaces of the substrates W hydrophobic is used, and to operate the bubbler 130 and to use the first path passing by way of the bubble removal parts 161 and 162 when the processing liquid for making the surfaces of the substrates W hydrophilic is used, irrespective of whether the substrates W are being processed or not processed during the time interval between the processes.

In the process of dipping the substrates W, the bubbles are supplied into the liquid in the processing tank in some cases for the purpose of other than the removal of the particles. In such cases, the use of the first path passing by way of the bubble removal parts 161 and 162 produces the effect of removing the particles. Thus, the circulation system 140 may be adapted to use the first path passing by way of the bubble removal parts 161 and 162 when the bubbles are supplied into the processing tank for some purpose; otherwise to use the second path passing by way of the filter 150.

In the above-mentioned instance, no filter is provided in the first path passing by way of the bubble removal parts 161 and 162. However, a filter may be provided downstream of and in series with the bubble removal parts 161 and 162. With such an arrangement, the downstream filter can remove the particles which have not yet been removed by the bubble removal parts 161 and 162 to improve particle removal efficiency. The frequency of the replacement of the filter in this case is lower than that in the background art because most of the particles are removed by the bubble removal parts 161 and 162.

3. Third Preferred Embodiment

Figure 15:
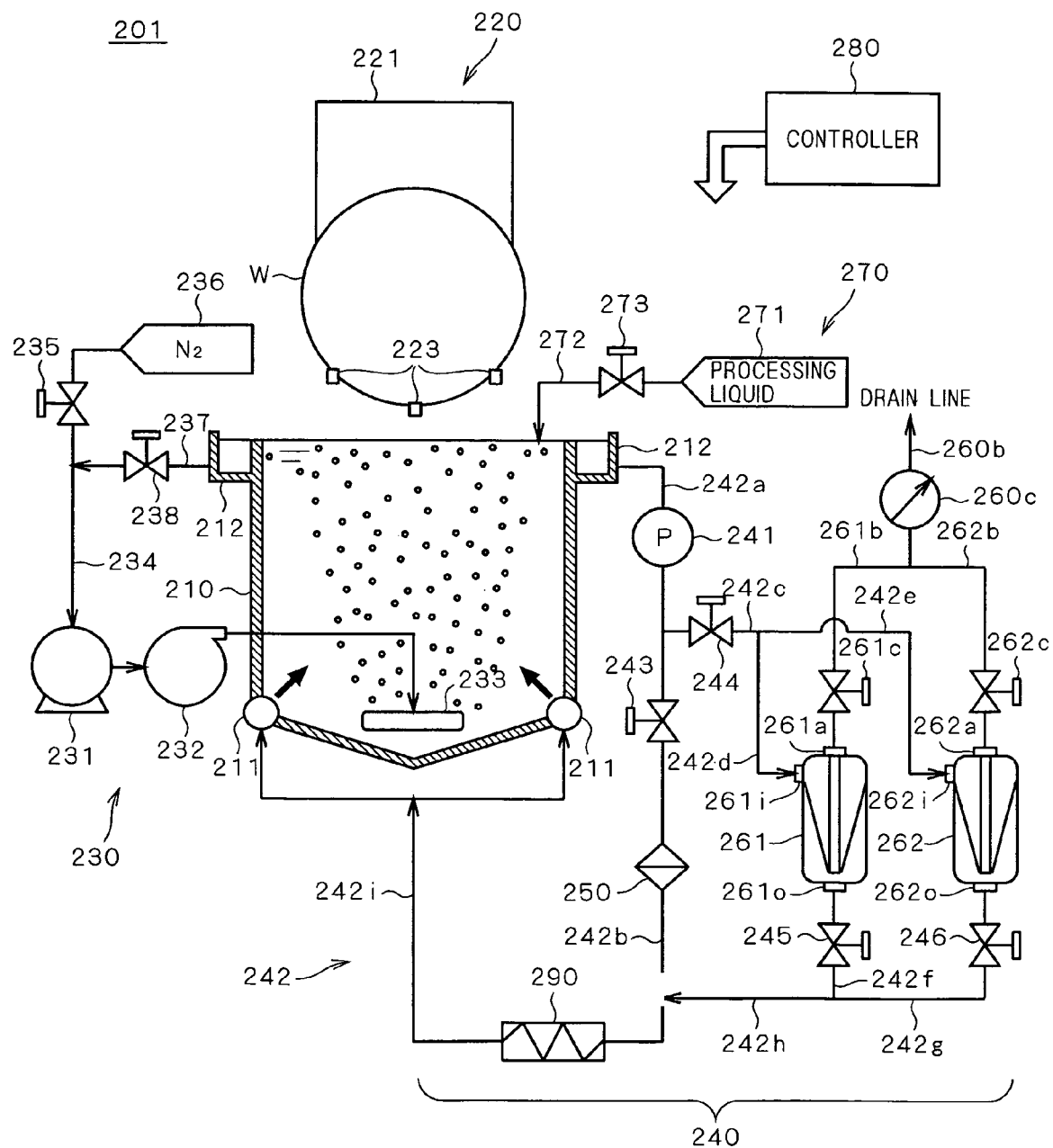
FIG. 15 is a vertical sectional view of the substrate processing apparatus taken along a plane parallel to each substrate according to a third preferred embodiment of the present invention.
Figure 16:
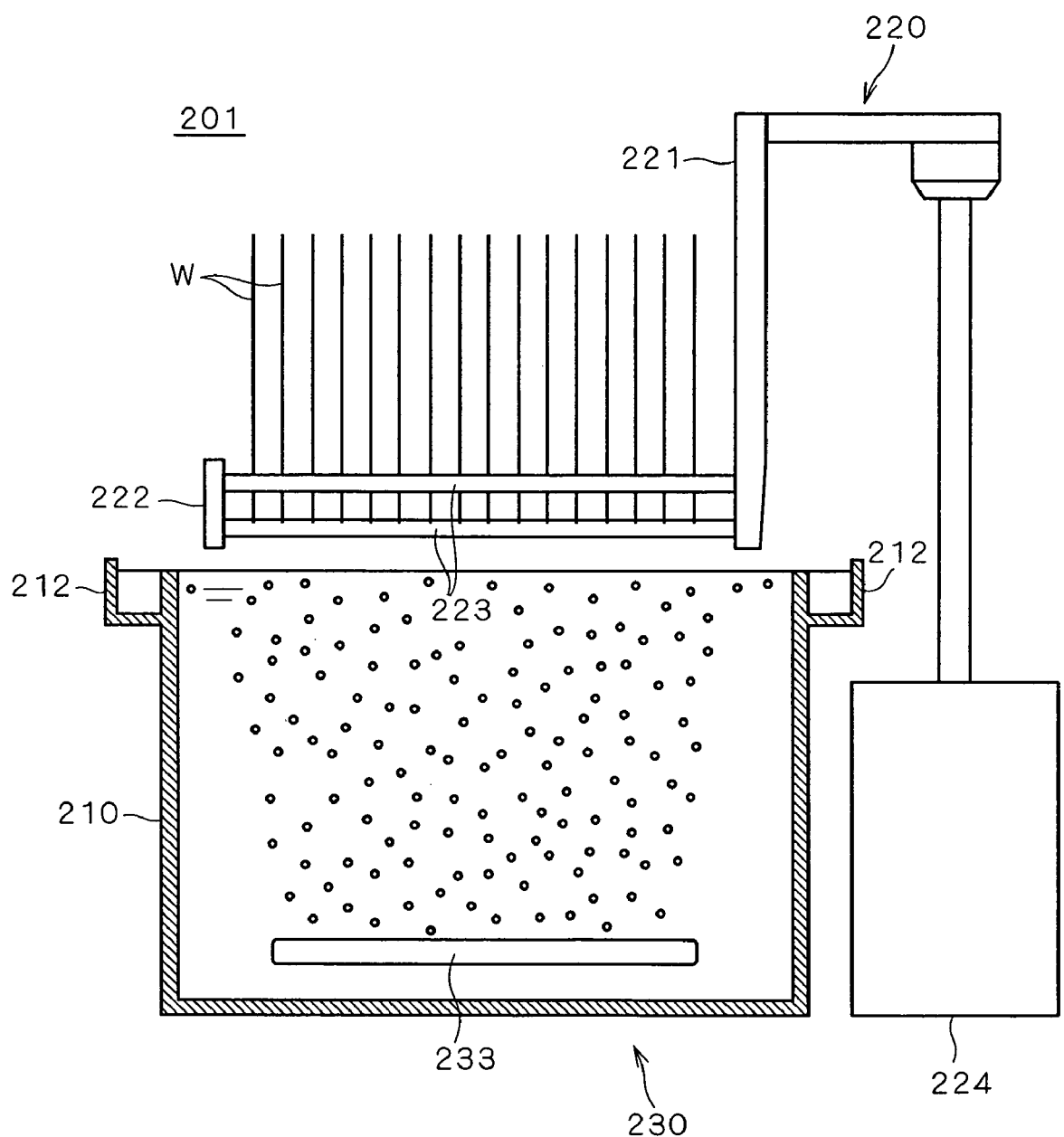
FIG. 16 is a vertical sectional view of the substrate processing apparatus taken along a plane perpendicular to each substrate according to the third preferred embodiment.

FIG. 15 is a vertical sectional view of a substrate processing apparatus 201 taken along a plane parallel to each substrate W according to a third preferred embodiment of the present invention. Piping and a control system are also shown in FIG. 15. FIG. 16 is a vertical sectional view of the substrate processing apparatus 201 taken along a plane perpendicular to each substrate W according to the third preferred embodiment.

As shown in FIGS. 15 and 16, the substrate processing apparatus 201 principally includes a processing tank 210, a lifter 220, a microbubble generator 230, a circulation system 240, a filter 250, bubble removal parts 261 and 262, a processing liquid supply system 270, and a controller 280.

The processing tank 210 is a vessel for storing a processing liquid such as deionized water therein. A process including a cleaning process and the like is performed by dipping substrates W in the processing liquid stored in the processing tank 210. Processing liquid discharge parts 211 are provided in a bottom portion of the processing tank 210, and the processing liquid is supplied from the processing liquid discharge parts 211 into the processing tank 210. The processing tank 210 has an open upper surface, and an outer tank 212 is provided on the upper end of the outer side surface of the processing tank 210. Deionized water supplied from the processing liquid discharge parts 211 flows upwardly in the processing tank 210, and then overflows through the opening at the top of the processing tank 210 into the outer tank 212.

The lifter 220 includes three holding rods 223 between a lifter head 221 and a holding plate 222. A plurality of holding grooves (not shown) are cut in the holding rods 223. A plurality of substrates W are held in an upright position in the holding grooves of the holding rods 223.

The lifter 220 is connected to a lifter drive part 224 having a servo motor, a timing belt and the like. When the lifter drive part 224 is operated, the lifter 220 moves up and down to reciprocally move the plurality of substrates W between a dip position inside the processing tank 210 and a raised position over the processing tank 210. For processing the substrates W using the processing liquid in the processing tank 210, the lifter 220 is moved down to dip the substrates W in the processing liquid within the processing tank 210. During a time interval between processing a group of substrates W and processing a next group of substrates W, the lifter 220 is held in the raised position.

The microbubble generator 230 is a device for generating microbubbles which are very small bubbles having a diameter of not greater than 50 μm. The microbubble generator 230 includes a gas-liquid mixing pump 231, a swirl accelerator 232, and a disperser 233. The gas-liquid mixing pump 231 is coupled through a pipe 234 and a valve 235 to a nitrogen gas source 236. A pipe 237 is coupled to the outer tank 212, and is joined to the pipe 234 by way of a valve 238. Thus, when the valve 235 and the valve 238 are opened, a nitrogen gas and the processing liquid are introduced into the gas-liquid mixing pump 231. The nitrogen gas and the processing liquid are mixed in the gas-liquid mixing pump 231, and fed to the swirl accelerator 232. The swirl accelerator 232 accelerates and swirls the nitrogen gas and the processing liquid to form a gas-liquid two-phase flow, and then feeds out the gas-liquid two-phase flow to the disperser 233. The disperser 233 shears the gas-liquid two-phase flow fed therein to form microbubbles, thereby discharging the microbubbles into the processing liquid within the processing tank 210.

The above-mentioned valves 235 and 238 are variable flow valves capable of adjusting the amounts of nitrogen gas and processing liquid, respectively, to be taken into the microbubble generator 230. The gas-liquid mixing pump 231 adjusts the flow rates of the nitrogen gas and processing liquid to be fed into the swirl accelerator 232. Adjusting these components 235, 238 and 231 parameters allows a change in microbubble generation conditions to adjust the size and amounts of microbubbles to be discharged from the disperser 233.

The microbubbles generated by such a microbubble generator 230 are generally defined as very small bubbles having a diameter of not greater than 50 μm when generated. The microbubbles are of a different type than ordinary bubbles in that the microbubbles cannot be generated by a general bubbling technique of, for example, merely discharging a gas from bubble holes but can be obtained only by shearing the gas-liquid two-phase flow as described above. Although nitrogen gas microbubbles are generated in this preferred embodiment, other gases may be used.

The circulation system 240 includes a pump 241 and piping 242, and feeds the processing liquid overflowing the top of the processing tank 210 back into the processing liquid discharge parts 211. The piping 242 includes a plurality of pipes 242a to 242i to feed the processing liquid through a plurality of paths back into the processing liquid discharge parts 211. The pipe 242a has a first end coupled to the outer tank 212, with the pump 241 inserted therein, and branches at its second end into the two pipes 242b and 242c. A valve 243 and the filter 250 are inserted in the pipe 242b. A valve 244 is inserted in the pipe 242c which in turn branches at its downstream end into the two pipes 242d and 242e. The pipes 242d and 242e are coupled to inlets 261i and 262i of the bubble removal parts 261 and 262, respectively. The pipes 242f and 242g are coupled to processing liquid outlets 261o and 262o of the bubble removal parts 261 and 262, respectively. Valves 245 and 246 are inserted in the pipes 242f and 242g, respectively. The pipes 242f and 242g are joined at their downstream ends to the single pipe 242h. The pipe 242b and the pipe 242h are joined to the single pipe 242i which in turn is coupled through a heater 290 to the processing liquid discharge parts 211.

In such a circulation system 240, the processing liquid is circulated by way of the filter 250 when the valve 244 is closed, the valve 243 is opened and the pump 241 is operated. The processing liquid is circulated by way of the bubble removal parts 261 and 262 when the valve 243 is closed, the valves 244, 245 and 246 are opened and the pump 241 is operated.

Figure 17:
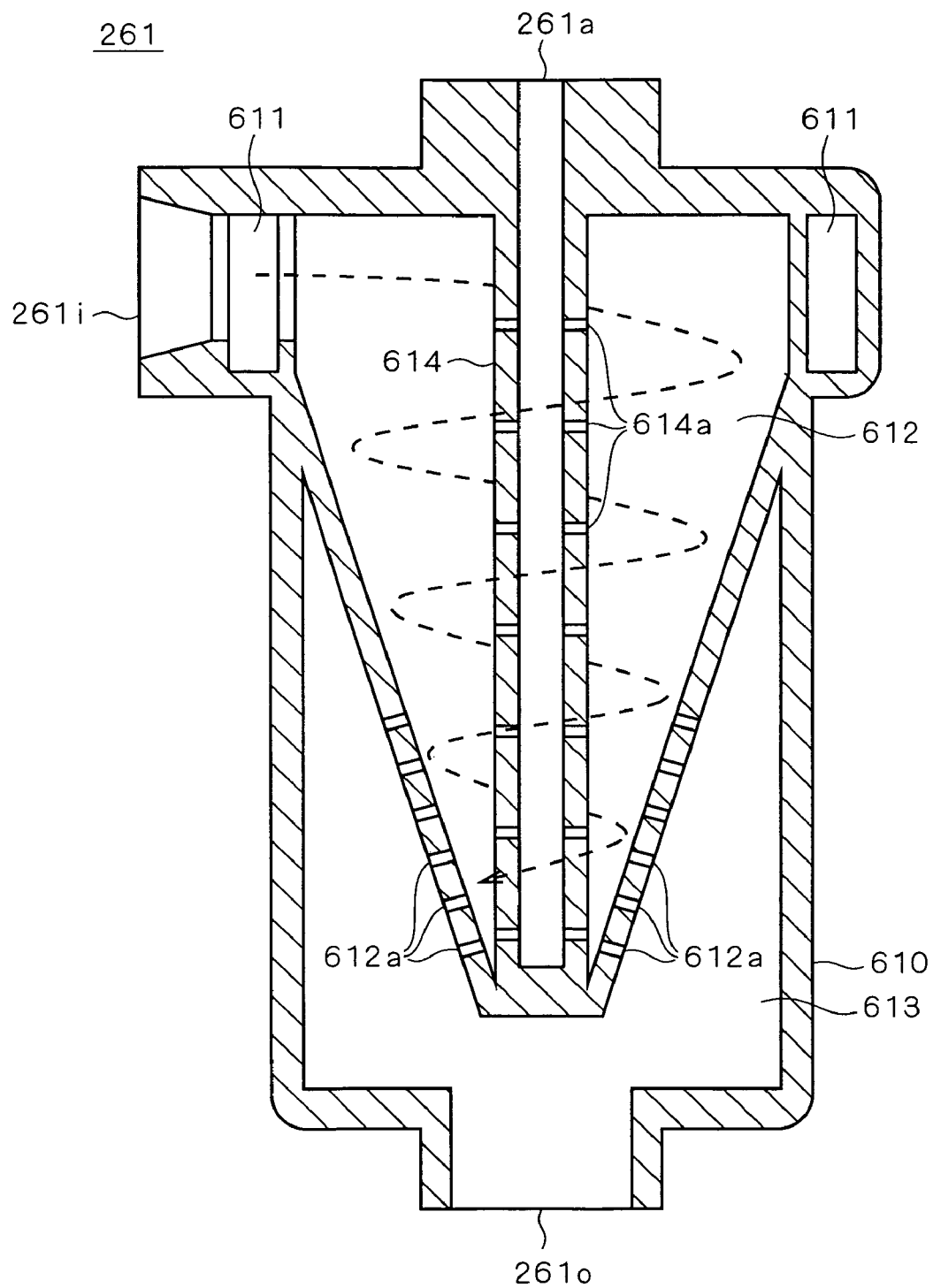
FIG. 17 is a vertical sectional view showing a construction of the bubble removal part.

Each of the bubble removal parts 261 and 262 is a device for swirling the processing liquid to gather the microbubbles contained in the processing liquid toward the center of the swirl, thereby removing the microbubbles. The bubble removal parts 261 and 262 are identical in construction with each other, and the construction of only the bubble removal part 261 is shown in FIG. 17. As shown in FIG. 17, the bubble removal part 261 includes the substantially cylindrical case 610 in which are provided the pre-swirling flow chamber 611, the swirling flow chamber 612, the filtrate chamber 613, and the bubble removal tube 614. The pre-swirling flow chamber 611 is formed to surround an upper portion of the case 610. The swirling flow chamber 612 has a conic configuration tapering downwardly and is formed inside the pre-swirling flow chamber 611.

The processing liquid introduced through the inlet 261i makes a revolution within the pre-swirling flow chamber 611, and then flows into the swirling flow chamber 612 in the form of a swirling flow advancing in a direction tangential to the case 610. In the swirling flow chamber 612, the processing liquid flows downwardly while swirling along the side surface of the swirling flow chamber 612. In this process, the liquid having a higher density is gathered in a peripheral portion of the swirling flow chamber 612 and the microbubbles having a lower density are gathered in a central portion thereof by centrifugal force (the principle of a cyclone).

The plurality of small holes 612a are formed between the swirling flow chamber 612 and the filtrate chamber 613. Thus, the processing liquid gathered in the peripheral portion of the swirling flow chamber 612 is introduced through the small holes 612a into the filtrate chamber 613, and is then emitted through the processing liquid outlet 261 o into the pipe 242f.

The plurality of small holes 614a are also formed between the swirling flow chamber 612 and the bubble removal tube 614. Thus, the microbubbles gathered in the central portion of the swirling flow chamber 612 are introduced with a small amount of processing liquid through the small holes 614a into the bubble removal tube 614, and are then emitted through a bubble outlet 261a.

The bubble removal part 261 having such a construction and the bubble removal part 262 having a similar construction are placed in parallel with each other in this substrate processing apparatus 201. This reduces the burdens on each of the bubble removal parts to achieve the removal of the microbubbles more efficiently.

Referring again to FIG. 15, pipes 261b and 262b are coupled to the bubble outlets 261a and 262a of the bubble removal parts 261 and 262, respectively. The pipes 261b and 262b are joined to a single pipe 260b having a downstream end leading to a drain line. The microbubbles emitted through the bubble outlets 261a and 262a pass with a small amount of processing liquid through the pipes 261b, 262b and 260b to the drain line.

Variable flow valves 261c and 262c are inserted in the pipes 261b and 262b, respectively, to adjust the amount of processing liquid to be drained with the microbubbles. A flow meter 260c is inserted in the pipe 260b to measure the amount of processing liquid drained with the microbubbles.

The processing liquid supply system 270 includes a processing liquid source 271, a pipe 272 for connection between the processing tank 210 and the processing liquid source 271, and a valve 273 inserted in the pipe 272. Thus, the processing liquid is supplied from the processing liquid source 271 to the processing tank 210 by opening the valve 273.

The controller 280 are electrically connected to the lifter drive part 224, the gas-liquid mixing pump 231, the swirl accelerator 232, the pump 241, the heater 290, and the valves 235, 238, 243 to 246, 261c, 262c and 273 to control the operations of these components. Additionally, the controller 280 receives a result of measurement from the flow meter 260c.

Figure 18:
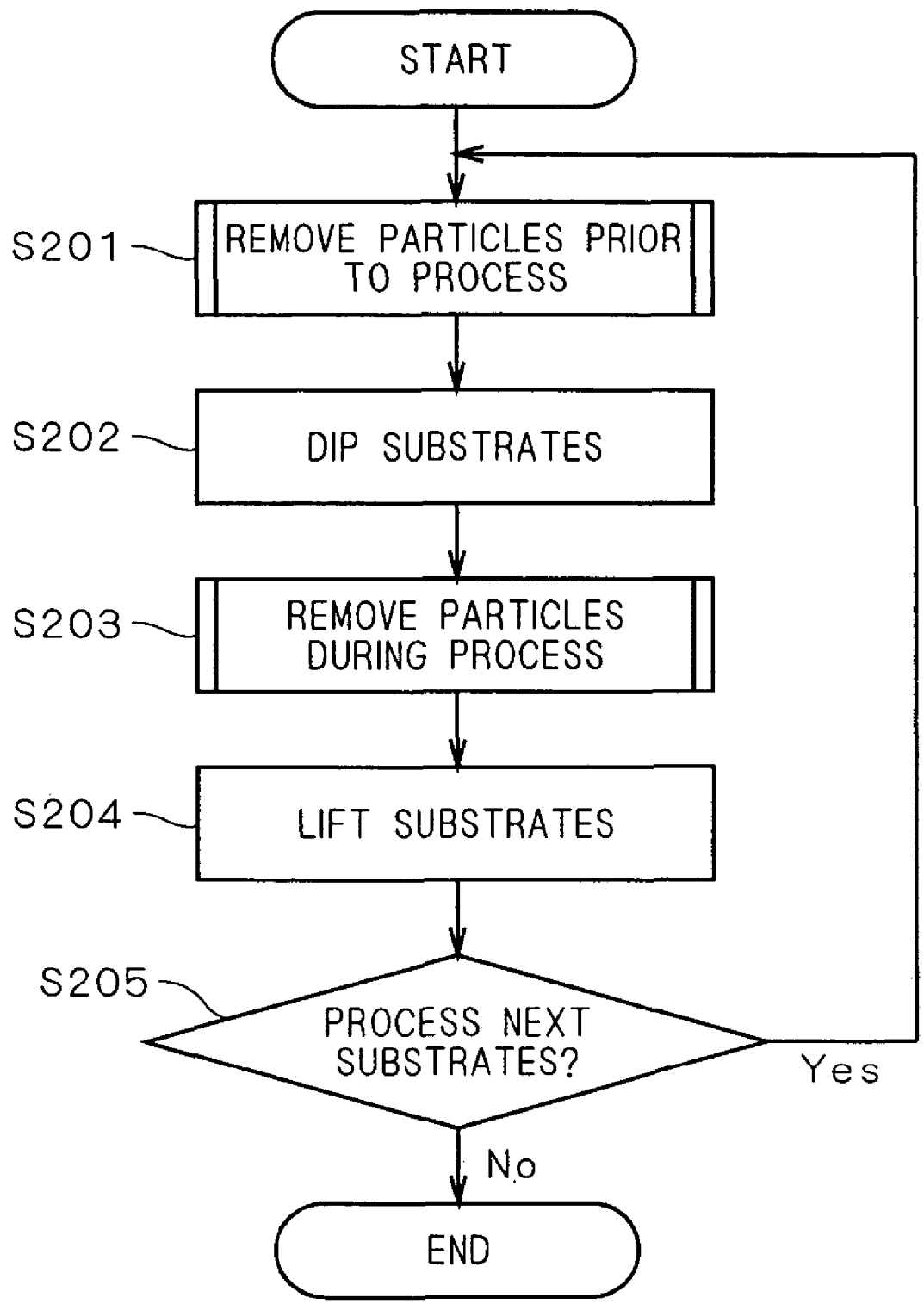
FIG. 18 is a flow chart showing a flow of operation according to the third preferred embodiment.

Next, the operation of the substrate processing apparatus 201 will be described. FIG. 18 is a flow chart showing a flow of operation of the substrate processing apparatus 201. The controller 280 controls the lifter 220, the gas-liquid mixing pump 231, the swirl accelerator 232, the pump 241, the heater 290, the valves 235, 238, 243 to 246, 261c, 262c and 273, and the like, whereby the operation to be described below proceeds.

Prior to and during the process of dipping substrates W, particles in the processing tank 210 are removed in the subsequent steps. An amount of processing liquid sufficient to circulate in the circulation system 240 is previously stored in the processing tank 210. The valve 243 is closed and the valves 244 to 246 are opened. The path in the circulation system 240 is established as a first path passing by way of the bubble removal parts 261 and 262.

Figure 19:
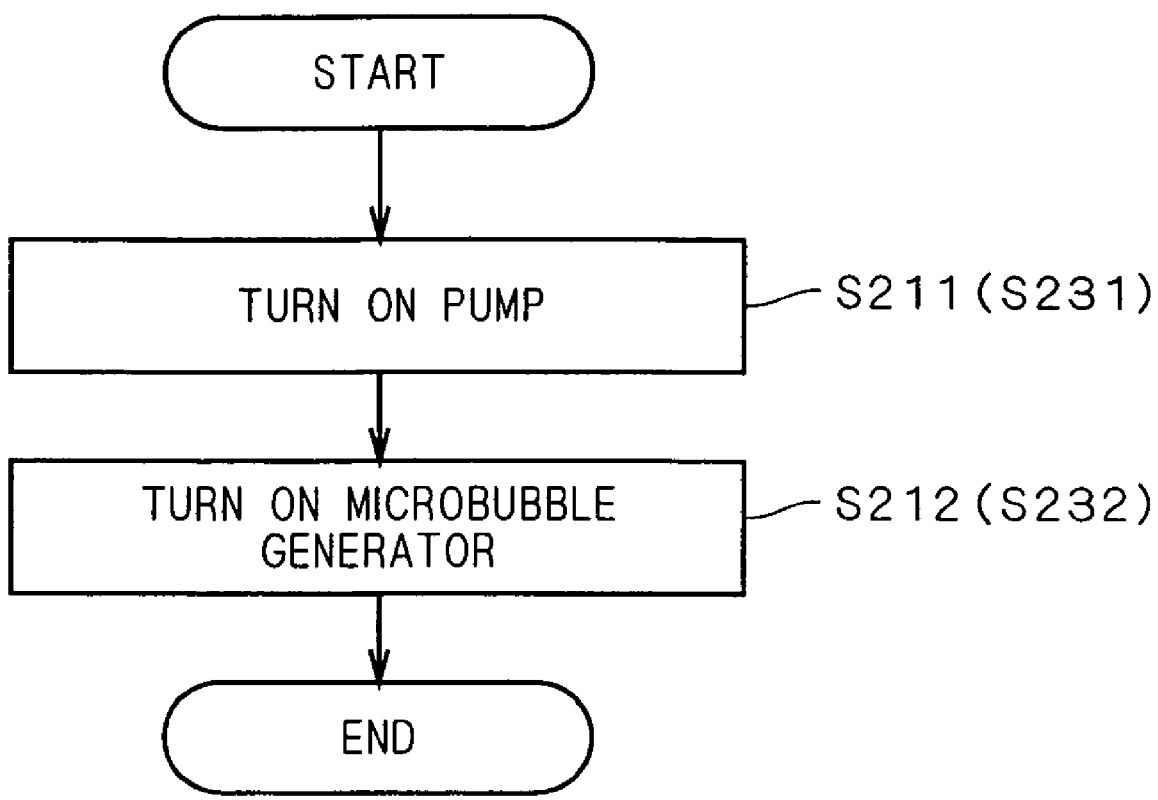
FIG. 19 is a flow chart showing a flow of operation in the particle removal step.

Prior to the process of dipping substrates W, particles in the processing tank 210 are removed (in Step S201). FIG. 19 is a flow chart showing the operation in the particle removal step in Step S201. In the particle removal step in Step S201, the pump 241 is operated and the processing liquid is circulated by way of the bubble removal parts 261 and 262 (in Step S211). Then, the valves 235 and 238 are opened, and the gas-liquid mixing pump 231 and the swirl accelerator 232 are operated, thereby to generate microbubbles in the processing liquid by the disperser 233 (in Step S212).

A flow of processing liquid directed upwardly of the processing tank 210 is formed in the processing tank 210, and the microbubbles discharged from the disperser 233 rise upwardly of the processing tank 210 in the flow of processing liquid. Thus, particles remaining in the processing tank 210 attach to the microbubbles and are carried upwardly of the processing tank 210 with the microbubbles. The microbubbles have a wide total surface area (gas-liquid interface area) because each of the microbubbles is very small in size. Thus, the particles in the processing liquid attach to the microbubbles efficiently. Additionally, the microbubbles, which have an electrification property, attract the particles in the processing liquid by the electrostatic action to cause the particles to attach thereto efficiently.

The microbubbles with the particles attached thereto overflow the top of the processing tank 210 into the outer tank 212 with the processing liquid, and flows into the circulation system 240. The microbubbles then pass through the pipes 242a, 242c, 242d and 242e, and are introduced through the inlets 261i and 262i into the bubble removal parts 261 and 262.

In the bubble removal parts 261 and 262, the processing liquid is swirled as described above, and the microbubbles in the processing liquid are gathered toward the center of the swirl and removed. In this process, the particles attaching to the microbubbles are also removed with the microbubbles. The microbubbles and particles removed in the bubble removal parts 261 and 262 are emitted with a small amount of processing liquid from the bubble outlets 261a and 262a through the pipes 261b and 262b and the pipe 260b into the drain line.

The processing liquid after the removal of the microbubbles is discharged through the processing liquid outlets 261o and 262o to the pipes 242f and 242g. The processing liquid through the pipe 242f and the processing liquid through the pipe 242g are joined together into the pipe 242h. Thereafter, the processing liquid passes through the pipe 242i, and is fed again into the processing tank 210.

The amount of processing liquid circulating gradually decreases because a small amount of processing liquid is drained with the microbubbles in the bubble removal parts 261 and 262. Thus, the variable flow valves 261c and 262c provided on the bubble discharge sides of the bubble removal parts 261 and 262 are adjusted to a minimum level required for the removal of the microbubbles. Further, the flow meter 260c measures the amount of drained processing liquid, and the valve 273 is opened based on the result of the measurement, thereby to replenish an insufficient amount of processing liquid.

Referring again to FIG. 18, the above-mentioned circulation by way of the bubble removal parts 261 and 262 is continued for a predetermined length of time to sufficiently remove the particles with the microbubbles in Step S201. After the completion of the removal of the particles, the microbubble generator 230 and the pump 241 are stopped.

Next, the process of dipping the substrates W is performed. In the process of dipping the substrates W, the lifter drive part 224 is first operated to dip the substrates W into the processing tank 210 (in Step S202). Thus, an etching process, a cleaning process or the like using the processing liquid is performed on the substrates W in the processing tank 210.

During the process of dipping the substrates W, the particles generated in the processing liquid within the processing tank 210 are removed at any time (in Step S203). The operation in the particle removal process is similar to that in Steps S211 to S212 shown in FIG. 19. First, the pump 241 is operated to circulate the processing liquid by way of the bubble removal parts 261 and 262 (in Step S231). Then, the microbubble generator 230 is operated to generate the microbubbles from the disperser 233 (in Step S232). Thus, the particles generated within the processing tank 210 attach to the microbubbles, circulate with the microbubbles, and then are removed in the bubble removal parts 261 and 262.

After the completion of the process of dipping the substrates W, the lifter 220 is moved upwardly to lift the substrates W (in Step S204). Thereafter, the substrates W are transported to another apparatus, and the process of the single group of substrates W in the substrate processing apparatus 201 is completed. The drying process is performed on the substrates W either while the substrates W are in the raised position in the substrate processing apparatus 201 or after the substrates W are transported to another apparatus.

After the completion of the process of the single group of substrates W, the controller 280 makes a judgment as to whether to process a next group of substrates W or not (in Step S205). If the next process is judged to be executed, the processing returns to Step S201 for the execution of the process of removing the particles remaining in the processing tank 210.

As described hereinabove, the substrate processing apparatus 201 supplies the microbubbles into the processing tank 210 to remove the microbubbles in the bubble removal parts 261 and 262. This allows the particles within the processing tank 210 to attach to the microbubbles and be removed with the microbubbles. The microbubbles has a wide total surface area because each of the microbubbles is very small in size. Thus, the particles in the processing liquid attach to the microbubbles efficiently.

Although the microbubbles having a diameter of not greater than 50 μm when generated are used in the above-mentioned instance, nanobubbles smaller than the microbubbles may be used. In general, the nanobubbles are defined as ultra-small bubbles having a diameter of less than 1 μm when generated. The use of such nanobubbles ensures an extremely wide total bubble surface area to allow the particles in the processing liquid to attach and be removed more efficiently.

However, the smaller the size of the bubbles is, the more difficult it is to remove the bubbles from the processing liquid. For example, it is more difficult for smaller bubbles to gather in the center of the swirl in the method of swirling the processing liquid to gather the bubbles in the center of the swirl, thereby removing the bubbles as described above. It is therefore desirable to supply small bubbles such as microbubbles and nanobubbles in the step of causing the particles to attach to the bubbles, and to make the size of the bubbles relatively large in the step of removing the bubbles. Specifically, a construction shown in FIG. 20, 21 or 22 may be employed.

Figure 20:
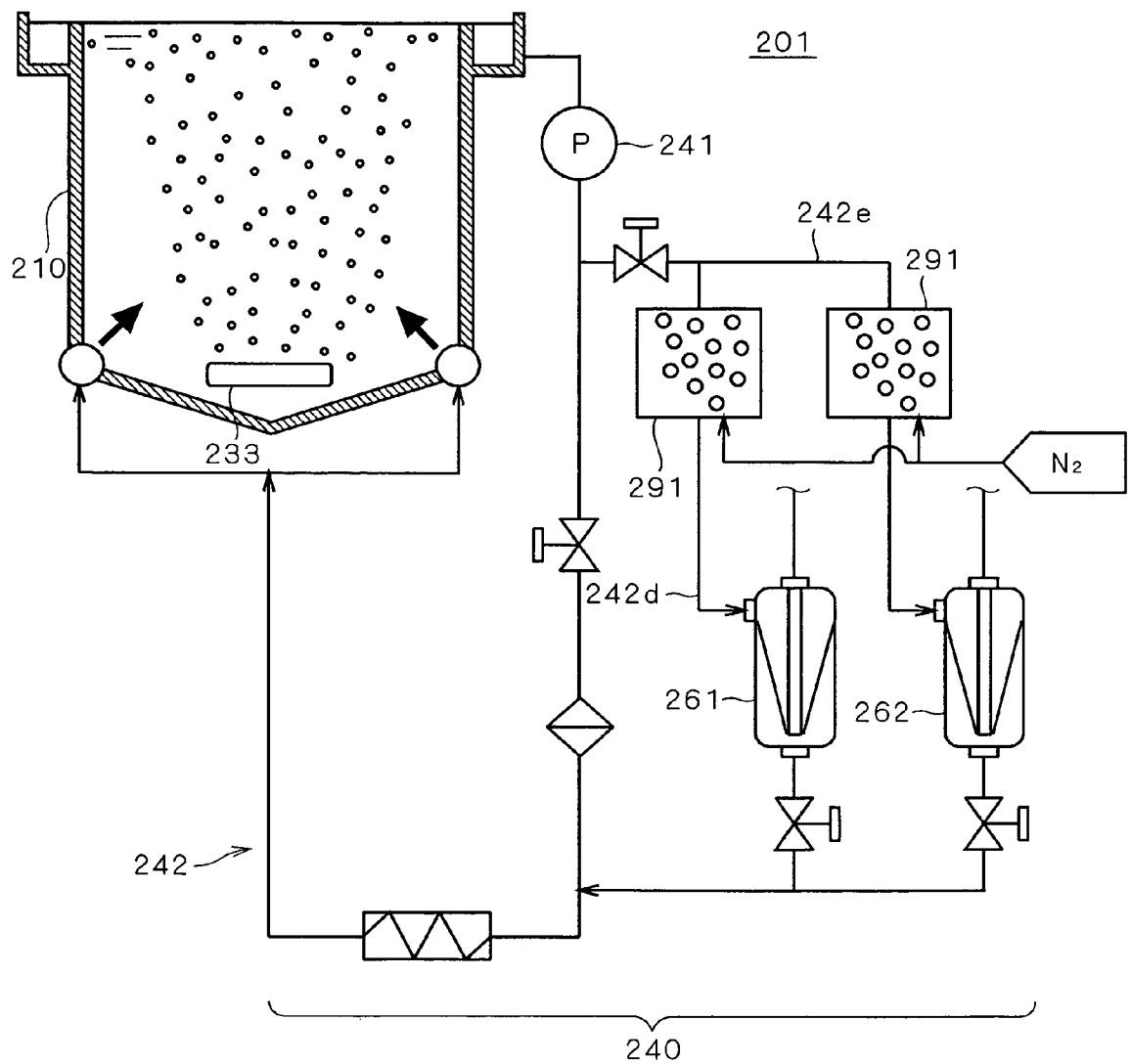
FIGS. 20 to 22 are views showing constructions of modifications of the substrate processing apparatus.

In the construction shown in FIG. 20, a bubble supply part 291 is provided upstream of each of the bubble removal parts 261 and 262 of the circulation system 240. The bubble supply part 291 generates bubbles larger in size than microbubbles and nanobubbles to supply the generated bubbles to the circulating processing liquid. In such a construction, the microbubbles or nanobubbles contained in the processing liquid are absorbed by and coalesce with the larger bubbles in the bubble supply part 291. The particles having attached to the microbubbles or nanobubbles are transferred to and attach to the larger bubbles after the coalescence, and flow with the larger bubbles into the bubble removal parts 261 and 262. Therefore, the construction shown in FIG. 20 can remove the bubbles and the particles efficiently in the bubble removal parts 261 and 262.

Figure 21:
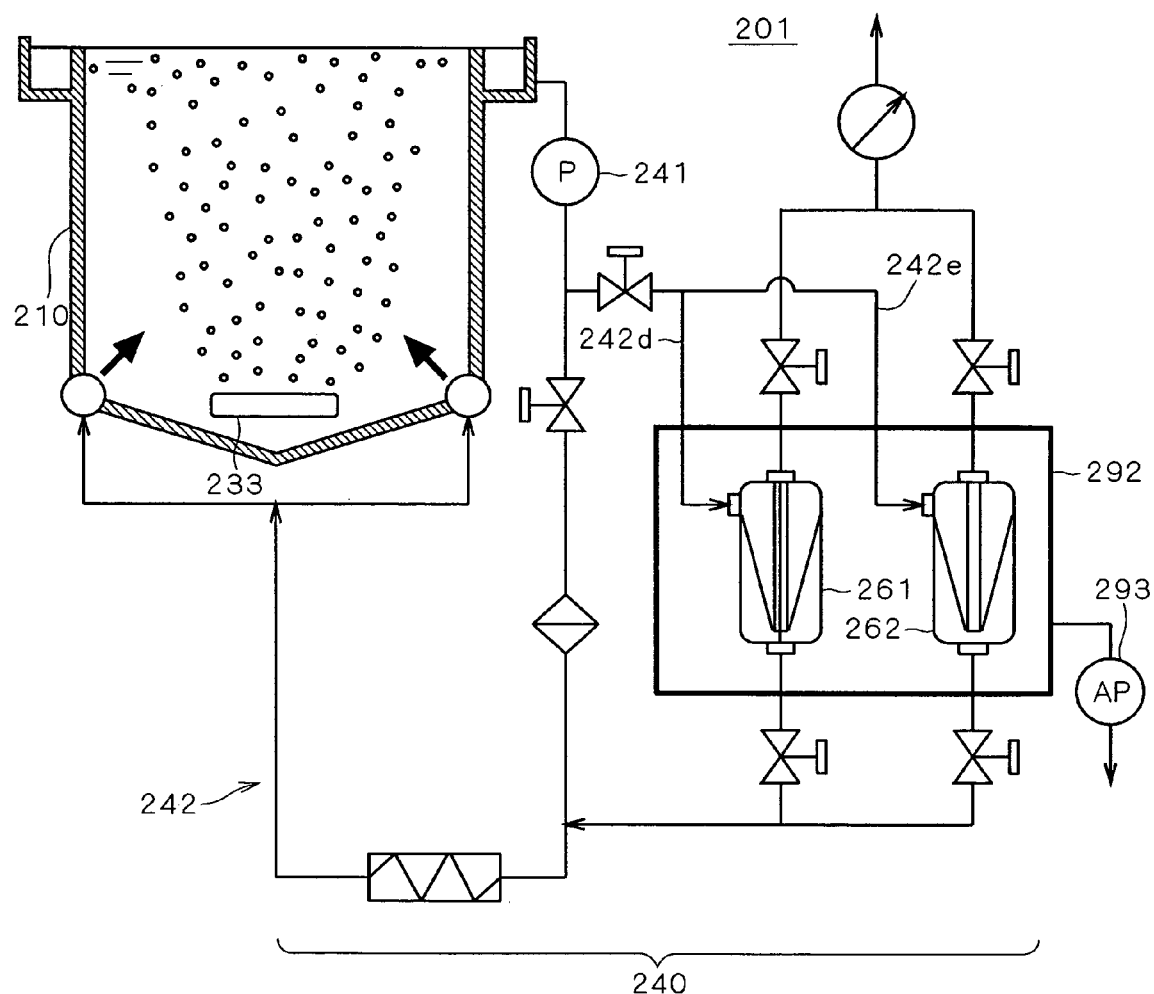

In the construction shown in FIG. 21, the bubble removal parts 261 and 262 are surrounded by a chamber 292, and an air pump 293 for reducing the pressure of an atmosphere in the chamber 292 is provided. Such a construction reduces the pressure only around the bubble removal parts 261 and 262 to expand the bubbles flowing into the bubble removal parts 261 and 262. Therefore, the construction shown in FIG. 21 can improve the efficiency of the removal of the bubbles and the particles in the bubble removal parts 261 and 262.

Figure 22:
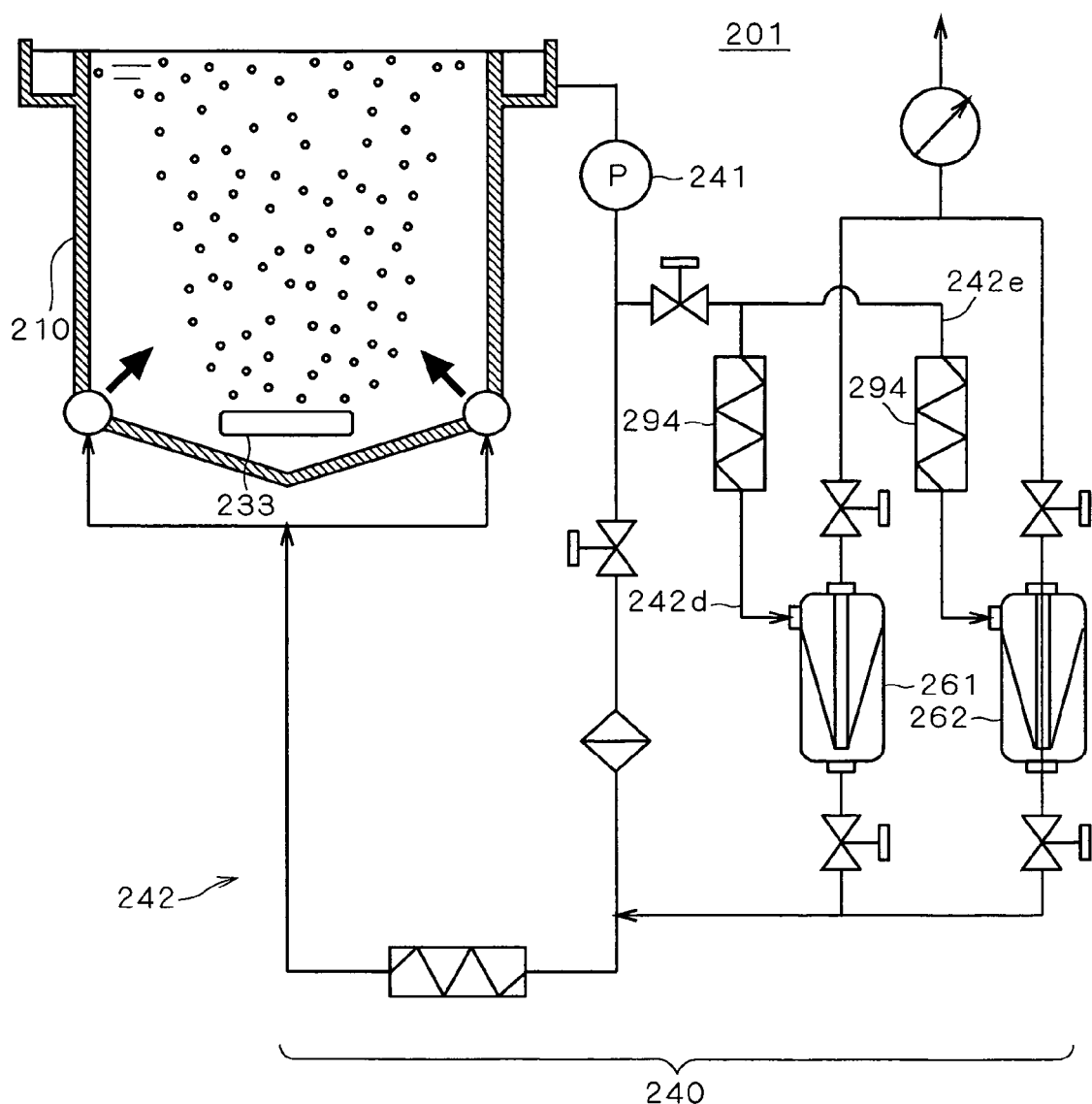

In the construction shown in FIG. 22, a heater 294 is provided upstream of each of the bubble removal parts 261 and 262 of the circulation system 240. The heater 294 heats the processing liquid flowing into the bubble removal parts 261 and 262. Such a construction expands the bubbles contained in the processing liquid by heating. Therefore, the construction shown in FIG. 22 can improve the efficiency of the removal of the bubbles and the particles in the bubble removal parts 261 and 262.

In the above-mentioned instance, the microbubbles are generated during the process and during the time interval between the processes, and are removed by circulation by way of the bubble removal parts. However, there is a danger that the substrates W being processed are affected by the bubbles such as the microbubbles if the substrates W are processed by using a processing liquid (e.g., hydrofluoric acid) for making the surfaces of the substrates W hydrophobic. Thus, the operation of the microbubble generator 230 may be stopped when the substrates W are processed by using the processing liquid for making the surfaces of the substrates W hydrophobic. In this case, the circulation system 240 may be adapted to circulate the processing liquid by way of the filter 250 by closing the valve 244 and opening the valve 243, thereby to remove the particles generated during the process by means of the filter 250.

While the invention has been described in detail, the foregoing description is in all aspects illustrative and not restrictive. It is understood that numerous other modifications and variations can be devised without departing from the scope of the invention.

What is claimed is:

1. A substrate processing apparatus for processing a substrate by using a liquid, comprising:
    a processing tank for storing a liquid;
    a bubble supply part for supplying bubbles into said processing tank;
    a circulation part for circulating a liquid overflowing the top of said processing tank to said processing tank; and
    a bubble removal part provided at some midpoint of a path of said circulation part for swirling the liquid to gather the bubbles contained in the liquid in the center of the swirl, thereby removing the bubbles,
    wherein said circulation part has at least one first path and a second path, and said circulation part includes said bubble removal part provided at some midpoint of said at least one first path, and a filter provided at some midpoint of said second path, said substrate processing apparatus further comprising a selector for selecting one of said at least one first path and said second path.

2. The substrate processing apparatus according to claim 1, wherein said selector selects said second path while a substrate is being processed by using the liquid stored in said processing tank, and selects said at least one first path prior to the process of the substrate or during a time interval between processes of substrates.

3. The substrate processing apparatus according to claim 1, wherein said selector selects said at least one first path when the liquid stored in said processing tank is a processing liquid for making a surface of the substrate hydrophilic, and selects said second path when the liquid stored in said processing tank is a processing liquid for making the surface of the substrate hydrophobic.

4. The substrate processing apparatus according to claim 1, further comprising an adjustment part for adjusting the amount of liquid to be removed with the bubbles in said bubble removal part.

5. The substrate processing apparatus according to claim 1, further comprising: a measurement part for measuring the amount of liquid to be removed with the bubbles in said bubble removal part;
a replenishment part for replenishing said processing tank with the liquid; and a controller for operating said replenishment part based on a result of measurement of said measurement part.

6. The substrate processing apparatus according to claim 1, wherein said at least one first path includes a plurality of first paths, and said plurality of first paths are placed in parallel with each other at some midpoint of the path of said circulation part.

* * * * *